US006850871B1

(12) United States Patent
Barford et al.

(10) Patent No.: US 6,850,871 B1
(45) Date of Patent: Feb. 1, 2005

(54) METHOD AND APPARATUS FOR EXTRACTION OF NONLINEAR BLACK-BOX BEHAVIORAL MODELS FROM EMBEDDINGS OF THE TIME-DOMAIN MEASUREMENTS

(75) Inventors: Lee A. Barford, San Jose, CA (US); Linda A. Kamas, Sunnyvale, CA (US); Nicholas B. Tufillaro, San Francisco, CA (US); Daniel A. Usikov, Foster City, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/420,607

(22) Filed: Oct. 18, 1999

(51) Int. Cl.[7] .............................................. G06F 17/10
(52) U.S. Cl. ............................. 703/2; 703/14; 703/15; 607/66
(58) Field of Search ............................... 703/14, 15, 2; 607/66

(56) References Cited

U.S. PATENT DOCUMENTS

| | | | | | |
|---|---|---|---|---|---|
| 3,746,847 A | * | 7/1973 | Maritsas | ...................... | 331/78 |
| 4,635,207 A | * | 1/1987 | Payne | .......................... | 702/70 |
| 4,944,009 A | * | 7/1990 | Micali et al. | .................. | 380/30 |
| 5,258,937 A | * | 11/1993 | Blackmon | .................... | 327/105 |
| 5,349,539 A | | 9/1994 | Moriyasu | | |
| 5,453,940 A | | 9/1995 | Broomhead et al. | | |
| 5,467,291 A | | 11/1995 | Fan et al. | | |
| 5,493,516 A | | 2/1996 | Broomhead et al. | | |
| 5,835,682 A | | 11/1998 | Broomhead et al. | | |
| 6,029,090 A | * | 2/2000 | Herbst | .......................... | 607/66 |
| 6,185,594 B1 | * | 2/2001 | Hilton et al. | ................ | 708/270 |

OTHER PUBLICATIONS

Walker et al., "Reconstructing the Dynamics of FET Oscillators Using Radil Basis Functions", http://www.drchaos-.net/drchaos/Papers/io_3.pdf, Apr. 13, 1999.*

Abarbanel et al., "Obtaining Order in a World of Chaos", IEEE Signal Processing Magazine, May 1998, pp. 49–65.*

Albertos, "Sampled–data Modeling and Control of Nonlinear Systems" Proceedings of the 35th IEEE Conference on Decision and Control, Dec. 11–13, 1996, pp. 925–930.*

Tufillaro, "A Dynamical Systems Approach to Behavior Modeling" HP Labs 1999 Technical Report, HPL–1999–22, Feb. 1999.*

Cao et al., "Determining the Minimum Embedding Dimensions of Input–Output Time Series Data", International Journal of Bifurcation and Chaos in Applied Sciences and Engineering, Jul., 1998, pp. 1491–1504.*

David M. Walker, "Reconstruction and Noise Reduction of Nonlinear Dynamics Using Nonlinear Filters", Doctor of Philosophy Thesis, The University of Western Australia, Department of Mathematics, submitted May 1998.

(List continued on next page.)

Primary Examiner—Kevin J. Teska
Assistant Examiner—Herng-der Day

(57) ABSTRACT

A method and apparatus that utilize time-domain measurements of a nonlinear device produce or extract a behavioral model from embeddings of these measurements. The method of producing a behavioral model comprises applying an input signal to the nonlinear device, sampling the input signal to produce input data, measuring a response of the device to produce output data, creating an embedded data set, fitting a function to the embedded data set, and verifying the fitted function. The apparatus comprises a signal generator that produces an input signal that is applied to the nonlinear device, the device producing an output signal in response. The apparatus further comprises a data acquisition system that samples and digitizes the input and output signals and a signal processing computer that produces an embedded data set from the digitized signals, fits a function to the embedded data set, and verifies the fitted function.

16 Claims, 9 Drawing Sheets

OTHER PUBLICATIONS

Stephen Boyd, et al, "Fading Memory and the Problem of Approximating Nonlinear Operators with Volterra Series," *IEEE Trans. Circuits Syst.*, vol. CAS–32, No. 11, Nov. 1985, pp. 1150–1161.

Norman Chang, et al, "Fast Time Domain Simulation in SPICE with Frequency Domain Data," *Proc. 47th Electronic Components and Technology Conference*, 1997, pp. 689–695.

Frans Verbeyst, et al, "VIOMAP, the S–Parameter Equivalent for Weakly Nonlinear RF and Microwave Device," *IEEE MTT–S Digest*, 1994, pp. 1369–1372.

Frans Verbeyst, et al, "The Volterra Input–Output Map of a High–Frequency Amplifier as a Practical Alternative to Load–Pull Measurements," *IEEE Trans. Instrum. Meas.*, vol. 44, No. 3, Jun. 1995, pp. 662–665.

Tim Sauer, et al, "Embedology," J. Stat. Physics, vol. 65, No. 3|4, 1991, pp. 579–616.

Martin Casdagli, "A Dynamical Systems Approach to Modelling Input–Output Systems," *Nonlinear Modeling and Forecasting*, vol. XII, of Santa Fe Institute Studies in the Sciences of Complexity, Addison–Wesley, 1992, pp. 265–281.

Holger Kantz, et al, *Nonlinear time series analysis*, Cambridge University Press, pp. 135–139.

Henery D.I. Abarbanel, "Obtaining Order in a World of Chaos," *IEEE Signal Processing Magazine*, May 1998, pp. 49–65.

Matthew B. Kennel, et al, "Determining Embedding Dimension for Phase Space Reconstruction Using the Method of False Nearest Neighbors," Physics Review A, vol. 45, No. 6, 1992, pp. 3403–3411.

Matthew B. Kennel, et al, "False Neighbors and False Strands: A Reliable Minimun Embedding Dimension Alogorithm," 1994.

N. Gershenfeld, "Chapter 14: Cluster and Density Estimation," The Nature of Mathematical Modeling, Cambridge Univ. Press, 1998, pp. 169–185.

N. Gershenfeld, "Chapter 16: Linear and Nonlinear Time Series," The Nature of Mathematical Modeling, Cambridge Univ. Press, 1998, pp. 204–224.

\* cited by examiner

Define the Voltage Profile for the Voltage Generator

First channel
Voltage=const+a1*sin(arg1)+a2*sin(arg2)+a3*sin(arg3)+CDMA
arg1=omega1*t+phi1    arg2=omega2*t+phi2    arg1=omega3*t+phi3 a1= .0000E+00    a2= .0000E+00    a3= .0000E+00
Omega1= .4000E-01    Omega2= .1000E+01    Omega3= .5000E-01
Phi1= .0000E+00    Phi2= .0000E+00    Phi3= .0000E+00
Const= .0000E+00

Pseudo CDMA (Code Division Multiple Access)
a= .1000E+01    Omega= .5000E-01

Second channel
Voltage=const+a1*sin(arg1)+a2*sin(arg2)+a3*sin(arg3)+CDMA
arg1=omega1*t+phi1    arg2=omega2*t+phi2    arg1=omega3*t+phi3 a1= .0000E+00    a2= .0000E+00    a3= .0000E+00
Omega1= .1000E+00    Omega2= .2000E+00    Omega3= .0000E+00
Phi1= .0000E+00    Phi2= .0000E+00    Phi3= .0000E+00
Const= .0000E+00

Pseudo CDMA (Code Division Multiple Access)
a= .0000E+00    Omega= .2000E-01

OK    Cancel

*FIG. 6*

METHOD AND APPARATUS FOR EXTRACTION OF NONLINEAR BLACK-BOX BEHAVIORAL MODELS FROM EMBEDDINGS OF THE TIME-DOMAIN MEASUREMENTS

BACKGROUND OF THE INVENTION

1. Field of the Invention

The present invention relates to the determination of behavioral models for nonlinear devices, circuits, subsystems or systems. In particular the present invention is a method for determining behavioral models for nonlinear devices, circuits, subsystems, and systems from embeddings of time-domain measurements.

2. Description of the Related Art

Linear, time invariant (LTI) devices, circuits, subsystems, and systems are completely characterized by their transfer functions. To understand the performance of an LTI device, one need only determine the transfer function of the LTI device. Once the transfer function is known, the operation of the device in a system is known completely for all input conditions. The same is true for LTI circuits, subsystems and systems.

A transfer function is a complex frequency-domain function that describes the output of an LTI device in terms of its inputs and, therefore forms a complete description of the LTI device. The term "complex function" when used herein refers to a function that includes a complex number having a real and an imaginary part. An equivalent form of the transfer function of an LTI device in the time-domain is called an impulse response of the LTI device. A one-to-one relationship exists between the transfer function in the frequency-domain and impulse response in the time-domain. In addition, the transfer function and the impulse response are not functions of and do not depend on the input signal that is applied to the LTI device.

The determination of the transfer function, especially if it involves measured data from the LTI device, is known as model development or model parameter extraction. Once a model of an LTI device is developed, or equivalently the transfer function is known, for a given device, the actual device may be replaced by a virtual device based on the model in any simulation of a system using the device. Often the development of the model involves extraction or determination of model parameters from a set of test data that represents the device of interest.

Transfer functions of LTI devices, circuits, subsystems, or systems can be extracted from measurements made with a vector spectrum or vector network analyzer. A swept or stepped frequency input signal is generated and the vector spectrum analyzer or network analyzer records the output of the LTI device. Then, a transfer function can be computed by comparing the input and output signals. Furthermore, models suitable for simulation of a given LTI device or circuit can extracted from transfer functions using, among other things, linear system identification techniques.

Time-domain measurements provide an alternate method of characterizing LTI devices or circuits. Pulse inputs that approximate an impulse are applied to a device and the outputs are measured and recorded. In one such well known, time-domain method, the poles and zeros of the Laplace transform of the governing differential equation of the device are estimated from the recorded output data. Once a suitable governing differential equation is determined, the device transfer function is calculated. In an alternative method, the measured data associated with the impulse response is transformed using a Fast Fourier Transform (FFT) to the frequency-domain where a linear system identification method is then used to extract the transfer function.

The characterization or modeling of nonlinear devices or circuits is much more difficult than that for LTI devices. Reference to a "nonlinear device" when used herein will be understood to include devices, circuits, subsystems or systems with a nonlinear input-output relationship. Unlike the linear case, the nonlinear device or circuit is not readily represented by a transfer function or impulse response, at least not one that is independent of the input signal or stimulus. However, there is still a need to model nonlinear devices so that their performance in systems can be evaluated efficiently. This is especially true when it is impractical or too expensive to use the actual device such as when the device is still being designed.

It is desirable to have a method for characterizing and developing a model of nonlinear devices to avoid the need to have the actual device available whenever its performance in a system must be investigated. Furthermore it is advantageous to have such a modeling method utilize a finite set of measurements, either actual measurements or measurements of a simulation of the device. The model so generated must accurately predict the performance of the device over all expected operational conditions within a given level of accuracy and with an acceptable amount of computational cost.

The term "behavioral model" herein refers to a set of parameters that define the input-output behavior of a device or circuit. Generally, a behavioral model must be of a form suitable for rapid simulation. "Simulated measurements" refers to values of voltage, current or other physical variables obtained from device, circuit or system simulation software. The objective of building a behavioral model from actual or simulated measurements is to reduce simulation time by replacing a complex circuit description in the simulation with a simpler, easier to simulate, behavioral model.

In many cases, nonlinear devices are electronic in nature (e.g. transistors, diodes). In these cases the measurements used to produce a model of the device are typically measured voltages and currents in and out of the ports of the device or equivalently incident or reflected power waves present at the ports at various frequencies. The models extracted from the measurements generally need to reflect the dynamic relationships between the voltages and currents at the ports. The model can be used, for example, to compute the currents into the ports from recent values of the voltages across the ports. Often this is the essential computation that must be provided to electronic circuit simulators by a software module that represents a device.

Mechanical and hydraulic devices can also exhibit nonlinear behavior and, therefore, be modeled as nonlinear devices for which construction of a suitable behavioral model would be beneficial. For example, a vehicular system comprising driver inputs and vehicle response may be represented in terms of a nonlinear behavioral model. In the case of vehicular systems, the input measurements might be of variables such as steering wheel position, brake pressure, throttle position, gear selection and the response measurements might be of variables such as the vehicle speed, lateral and longitudinal acceleration, and yaw rate. The behavioral model extracted from the measurements needs to reflect the dynamic relationship between the driver inputs that are applied and the subsequent response of the vehicle. In other words, the model defines a "virtual car" that can be "driven" using previously recorded or real-time measured driver inputs.

A variety of methods have been developed to characterize and develop models of nonlinear devices. However, these methods generally have severe limitations associated with them. For instance, many of the techniques are limited to use with so called "weakly nonlinear devices", those devices whose performance is nearly linear. Therefore, these techniques are not suitable for many nonlinear devices.

One such approach to characterization of weakly nonlinear devices is to simply assume that the device is linear, at least in the operational range of interest. Under this assumption, a variant of the time-domain impulse response method described hereinabove can be used. For devices that are, in fact, weakly nonlinear devices, this approach yields reasonably good results. However, the accuracy of such a model will degrade rapidly as the amount or degree of nonlinearity in the device increases.

Another class of methods for characterizing nonlinear devices is represented by the Volterra input-output maps method (VIOMAPs) also known as the Volterra Series Method. VIOMAPs are models of nonlinear devices or circuits that can be extracted from frequency domain measurements such as those produced by using a vector spectrum analyzer. Here again, the usefulness of such models is limited by the assumption of weak nonlinearity. In addition, VIOMAPs and related methods can only model the steady state behavioral or response of the device. A steady-state response is the response of a device, linear or nonlinear, to a repeating input signal. An example of a steady-state response is the response to a sine wave input after sufficient time has passed to allow the transients associated with the application of the sine wave to decay. VIOMAPs and the related methods are powerful methods that have found many useful applications. However, VIOMAPs, as noted above, cannot handle strong nonlinearities or transient inputs. VIOMAPs are restricted to modeling the steady state behavior of devices that exhibit weak nonlinearities.

Another, somewhat different, method of characterizing nonlinear devices is to use an equivalent circuit representation of the device of interest. The approach in this method is to assume an equivalent circuit topology with a certain circuit parameter left free or unspecified that is expected to adequately represent the device or circuit. For example, equivalent circuits are known that adequately represent certain classes of transistors (e.g. MOSFETs or BJTs). Given the assumed equivalent circuit, a set of measurements is performed on the device from which the correct values of the free parameters can be computed or deduced for a particular device.

As with the other methods, this approach for nonlinear device characterization has a number of serious disadvantages. Chief among the disadvantages is the need for a priori knowledge of an equivalent circuit that adequately represents the device of interest. This often means that significant knowledge of the device is required before modeling can begin. If incorrect assumptions are made regarding the structure of the equivalent circuit, the method may not yield satisfactory results. Put another way, the approximation that is being made by choosing a particular equivalent circuit over another has an impact on accuracy that is hard to determine. In addition, this method is only useful when the device being modeled is of a type similar to electronic circuitry (e.g. a hydraulic device or spring-mass-dashpot system) that a representative equivalent circuit can be created. Finally, the equivalent circuit can require a significant amount of computer time to simulate, thereby often making this method unacceptably costly for use in the simulation of large systems.

Therefore, it would be desirable to have a method for the construction of a behavioral model of a nonlinear device that is not limited to assuming the device is weakly nonlinear and that does not require excessively large amounts of computational effort to produce simulated results. In addition, it would be desirable if this method were not limited to steady-state response characterizations and this method did not require any a priori knowledge of the device being modeled. Finally, it would be advantageous if this method would allow the model to be constructed from either actual measurements or simulated measurements of the device. Such a nonlinear characterization and model construction method would overcome a long-standing problem in the area of nonlinear device modeling technology.

SUMMARY OF THE INVENTION

The present invention is a method and apparatus for producing behavioral models of nonlinear devices that overcomes the disadvantages of the aforementioned methods. In particular, the method and apparatus of the present invention utilize time-domain measurements of a nonlinear device to produce or extract a behavioral model from embeddings of these measurements. The resulting behavioral model of the nonlinear device is a black-box model that accommodates devices with one or more input ports and one or more output ports. The black-box model produced by the subject invention is a functional form as opposed to a structural form.

In accordance with the present invention, the method of producing a behavioral model of a nonlinear device from embeddings of time-domain measurements comprises the steps of applying an input signal to the nonlinear device, or equivalently to a virtual device, sampling the input signal to produce input data, measuring a response to the input signal at the output of the device to produce output data corresponding to the input data, creating an embedded data set using a first subset of the input data and a first subset of the output data, fitting a function to the embedded data set, and verifying the fitted function using a second subset of the input data and a second subset of the output data, wherein the verified fitted function is the behavioral model of the nonlinear device. In another embodiment, the fitted function can be used to compute a continuous-time model from the discrete behavioral model developed in the aforementioned steps.

The apparatus of the present invention comprises a signal generator that produces an input or excitation signal that is applied to the input of the nonlinear device to thereby produce an output signal. The apparatus of the present invention further comprises a data acquisition system. The data acquisition system samples or digitizes the input signal applied to the device and output signal produced by the device to produce input data and output data. The output data represents a measured response of the device. The apparatus of the present invention further comprises a signal processing computer or signal processor. The input data and the output data produced by the data acquisition system are processed by the signal processing computer. The signal processing computer utilizes a first subset of the input data and a first subset of the output data to create an embedded data set. The signal processing computer then fits a function to the embedded data set. As used herein, the terms "fits a function" refers to the development of a function that maps the embedded data to a domain of the output data. The signal processing computer verifies that the fitted function accurately models the device using a second subset of the input data and a second subset of the output data. The verified fitted function is the behavioral model of the nonlinear device. In another embodiment, the signal processor of the apparatus of the present invention further computes a continuous-time model from the discrete behavioral model produced by the fitted function.

Unlike the aforementioned conventional methods, the method and apparatus of the present invention are not restricted to modeling weakly nonlinear devices but can handle hard or strong nonlinearities. The method and apparatus of the present invention accommodate steady-state as well as dynamic nonlinearities, require no a priori assumptions regarding the device model structure and can handle devices with multiple, dependent inputs. The method and apparatus work in the discrete domain with sampled measurements of input and output variables but are readily extended to a continuous representation of the device behavioral model. As such, the behavioral models produced by the method and apparatus of the present invention are general in nature and are readily implementable representations of nonlinear devices including those exhibiting strong nonlinearities.

The method and apparatus of the present invention are general, which means that they may be applied to any device having well defined inputs and outputs that can be related by a reasonable number of nonlinear, ordinary differential equations. Moreover, the nonlinear device may operate through electronic, mechanical, hydraulic, aerodynamic, or chemical physical processes or any combination thereof. In addition, the method and apparatus of the present invention properly handle so-called "hard" or strong nonlinearities. The term "hard" nonlinearities means linearities that are much more severe than a small deviation from linearity in the vicinity of a mostly linear operating point.

The method and apparatus of the present invention also handle devices that exhibit dynamic or non-static nonlinearities and therefore, are not restricted to steady-state situations. The behavioral model produced by the present invention can represent devices with one or more inputs and one or more outputs and the inputs and outputs can be mutually dependent. Finally, no a priori assumptions need be made about the structure of the ordinary differential equations that govern the device, though there are practical limits to the size of model, in terms of number of effective state variable, that can be modeled. Equivalently, no a priori assumption need be made concerning the topology of an electronic circuit equivalent in operation to the device.

In another aspect of the invention, a method of constructing an input or excitation signal is provided. The excitation signal that is constructed is applied to a nonlinear device for behavioral model extraction from embedded time-series measurements according to the invention.

Moreover, the behavioral model created from the method and apparatus of the present invention can be used to simulate the output of the device, given input signals in the frequency-domain and the excitation signals utilized can be generated at reasonable cost at any frequency up to and beyond microwave frequencies.

BRIEF DESCRIPTION OF THE DRAWINGS

The various features and advantages of the present invention may be more readily understood with reference to the following detailed description taken in conjunction with the accompanying drawing, where like reference numerals designate like structural elements, and in which:

FIG. 6 illustrates a dialog box used to specify the input signal used in the bipolar junction transistor example.

DETAILED DESCRIPTION OF THE PREFERRED EMBODIMENTS

The method and apparatus of the present invention utilize time-domain measurements of a nonlinear device to produce or extract a black box behavioral model of the device from embeddings of these measurements. The method and apparatus of the present invention are applicable to the modeling of devices where information about the device is provided by either actual measurements or simulated measurements.

The use of embeddings to extract models from time domain measurements of nonlinear devices is called nonlinear time series analysis (NLTSA). The term "black box" as used herein refers to a model that requires little or no detailed information about the device such as the topology of an equivalent circuit, or knowledge of the underlying physics of the device, be known before the model is constructed. The term "embedding" as used herein refers to a function or mapping from a set U to a new set W, where $U \rightarrow W | U \in \Re^m$; $W \in \Re^n$ $n \geq m$.

Figure 1:
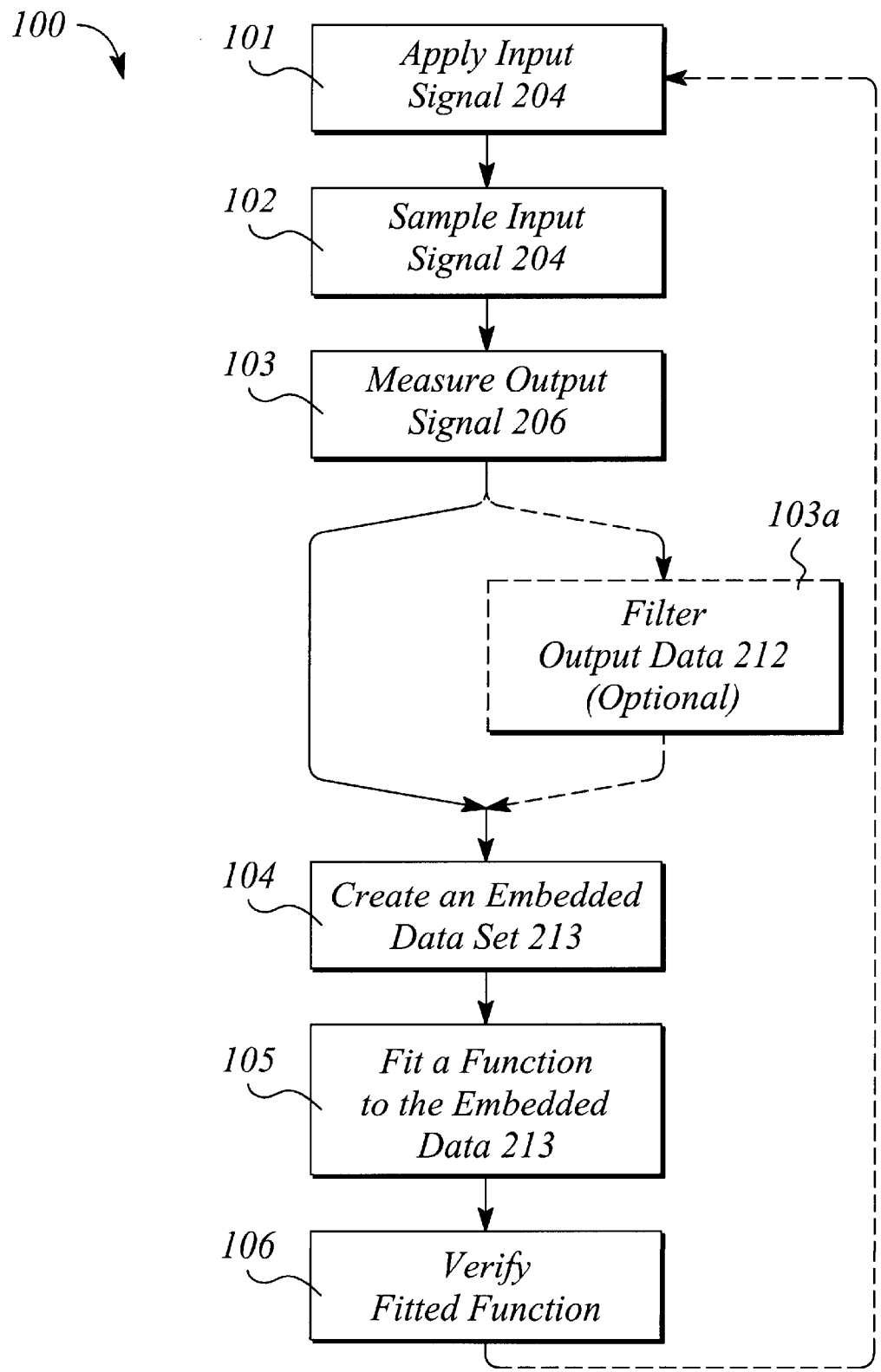
FIG. 1 illustrates a block diagram of the method of producing a behavioral model of the present invention.

A block diagram of the method of the present invention is illustrated in FIG. 1. In accordance with the invention, the method 100 of producing a behavioral model of a nonlinear device from embeddings of time-domain measurements is an iterative process and comprises the step of applying 101 an input signal 204 to the nonlinear device. The input signal 204 can be any time-domain signal or combination of signals. In general, the selection or construction of the input signal 204 may be iterative and dependent on the characteristics of the nonlinear device, such as operational frequency range and peak voltage levels. The construction of the input signal 204, also referred to herein as an excitation signal, is further described below.

The method 100 further comprises the step of sampling 102 the input signal 204 to produce input data 210. The input signal 204 is sampled at discrete time intervals during the step of applying 101. The time intervals can be fixed or variable and generally depend on the input signal 204 characteristics. Sampling 102 may be either actual sampling of the input signal 204 as it is applied to the device or virtual sampling wherein the samples are created directly from a mathematical description of the input signal 204. In the preferred embodiment, the time intervals are fixed according to standard engineering practice and the input data 210 is stored as an array of values in a computer memory.

The method 100 further comprises the step of measuring 103 an output signal or a response signal 206 to the input signal 204 at an output port of the device to produce output data 212 corresponding to the input data 210. The response is measured at discrete time intervals and the output data 212 represents a time-series of the response signal. In the preferred embodiment, the response signal 206 is measured at the same discrete time intervals and times as is used for sampling 102 the input signal 204 and the output data 212 is stored as a separate array or set of values in a computer memory.

In the preferred embodiment, the step of measuring 103 is followed by a step of filtering 103a the output data 212. The step of filtering 103a is used to reduce the noise content of the output data 212. Noise is a corruption of the data that may be introduced during the step of measuring 103 and is well known to one skilled in the art. The step of filtering 103a may be accomplished using either linear or nonlinear filtering techniques. Preferably, the data 212 is filtered using one of several nonlinear filtering techniques known in the art and described further below. Nonlinear filtering techniques have the advantage of preserving the nonlinear response characteristics of the device present in the output data 212. Moreover, where the input data 210 is sampled directly from the input signal 204, the input data 210 may also be filtered using well known techniques.

The method 100 further comprises the step of creating 104 an embedded data set 213 using a first subset of the input data and a first subset of the output data. The step of creating 104 an embedded data set 213 comprises the steps of determining an embedding type and dimension and then embedding the first subsets in an embedding space defined in the step of determining. Applicable embedding types of the present invention include but are not limited to so called "lagged" embeddings, embeddings using singular value decomposition (SVD) of the data, wavelet embeddings and combinations thereof. The embedding types differ by the specific linearly independent functions that are used, as is described further hereinbelow. However, in general terms, the embedding type can be represented by a set of functions E as given by $$E = \begin{cases} e_1(\vec{y}(t-\tau), \ldots, \vec{y}(t-l\tau), \vec{u}(t-\tau), \ldots, \vec{u}(t-m\tau)), \\ e_2(\vec{y}(t-\tau), \ldots, \vec{y}(t-l\tau), \vec{u}(t-\tau), \ldots, \vec{u}(t-m\tau)), \\ \vdots \\ e_n(\vec{y}(t-\tau), \ldots, \vec{y}(t-l\tau), \vec{u}(t-\tau), \ldots, \vec{u}(t-m\tau)) \end{cases}$$

where n=l+m, where elements of the set, $e_n$, are functions of the input and output data sets and where l, m, and $\tau$ are dependent on the specific embedding type and related to the embedding dimension. An example of a function from an embedding E is a first order approximation of a derivative of the output variable $\vec{y}(t)$ given by $$e_1(\vec{y}(t-\tau), \ldots, \vec{y}(t-l\tau), \vec{u}(t-\tau), \ldots, \vec{u}(t-m\tau)) = \frac{y(t-2\tau) - y(t-\tau)}{\tau}$$

Another example of an applicable embedding function $e_n$ is the Haar wavelet of length 4 operating on $\vec{y}(t)$ given by $$e_2(\vec{y}(t-\tau), \ldots, \vec{y}(t-l\tau), \vec{u}(t-\tau), \ldots, \vec{u}(t-m\tau)) =$$
$$y(t-4\tau) + y(t-3\tau) - y(t-2\tau) - y(t-\tau)$$

The subscripts in these examples are arbitrary. A so-called "pure" lag embedding would be given by $$\vec{E}_{\log} = \begin{cases} e_1(\vec{y}(t-\tau), \ldots, \vec{y}(t-l\tau), \vec{u}(t-\tau), \ldots, \vec{u}(t-m\tau)) = \vec{y}(t-\tau), \\ e_2(\vec{y}(t-\tau), \ldots, \vec{y}(t-l\tau), \vec{u}(t-\tau), \ldots, \vec{u}(t-m\tau)) = \vec{y}(t-2\tau), \\ \vdots \\ e_k(\vec{y}(t-\tau), \ldots, \vec{y}(t-l\tau), \vec{u}(t-\tau), \ldots, \vec{u}(t-m\tau)) = \vec{u}(t-m\tau) \end{cases}$$

where k=l+m. Therefore, it would be evident to one skilled in the art that a set of functions of the input and output data can be chosen.

Determining the embedding dimension, in part, involves choosing the number of linearly independent functions to be used. The combination of the embedding dimension and the embedding type or functions defines the embedding space. Along with determining an embedding type, determining the embedding dimension is often accomplished in practice in an iterative process. In the step of embedding, the first subset of the input data and the first subset of the output data are "embedded" in the embedding space defined and dimensioned in determining an embedding type. The step of embedding transforms the first subset of the input data and the first subset of the output data into a first embedded data set. In general, the amount of data contained in the first embedded data set is larger than that in the original first subsets.

In the preferred embodiment, the first subset of input data and the first subset of output data contain less data than the total data produced for each. The remaining portions of the input data 210 and the output data 212 not included in the first subsets are used in a verification step 106 described below and are referred to a second subset of input data and a second subset of output data respectively. In another embodiment, the first subsets comprise all of the available data and therefore, additional data are generated for the second subsets after the step of creating 104 the embedded data set 213 for use in the verification step 106. The step of creating 104 the embedded data set 213, in particular the step of determining the embedding type and the embedding dimension, is described further hereinbelow.

The method 100 further comprises the step of fitting 105 a function G(·) from embedded data set 213 to the corresponding output data 212. In general, the function G(·) is a function of the embedded data set 213 created in the step of embedding.

$$\vec{y}(t) = G \begin{cases} e_1(\vec{y}(t-\tau), \ldots, \vec{y}(t-l\tau), \vec{u}(t-\tau), \ldots, \vec{u}(t-m\tau)), \\ e_2(\vec{y}(t-\tau), \ldots, \vec{y}(t-l\tau), \vec{u}(t-\tau), \ldots, \vec{u}(t-m\tau)), \\ \vdots \\ e_n(\vec{y}(t-\tau), \ldots, \vec{y}(t-l\tau), \vec{u}(t-\tau), \ldots, \vec{u}(t-m\tau)) \end{cases} \quad (A)$$

where $\vec{y}(t)$ is the first subset of the output data at time t, $\vec{u}(t)$ is the first subset of the input data at time t, l is the number of lagged data samples taken from the first output data subset, m is the number of lagged data samples taken from the first input data subset and $\tau$ is a multiple of a time between samples $\Delta t$ ($\tau = k\Delta t$) also called a "lag". The sample interval or sample time $\Delta t$ corresponds to the above-described discrete time interval used in the sampling step 102 and the measuring step 103. In the specific case of a lag embedding, the function $G(\cdot)$ is of the form $$\vec{y}(t) = G(\vec{y}(t-\tau), \ldots, \vec{y}(t-l\tau), \vec{u}(t-\tau), \ldots, \vec{u}(t-m\tau)) \quad (B)$$

A corresponding form of $G(\cdot)$ for other embedding types would be readily apparent to one skilled in the art.

The step of fitting 105 comprises the steps of determining the function $G(\cdot)$, and selecting the structural parameters ($\tau$, l and m in the lagged embedding case) and/or other parameters of function $G(\cdot)$. For example, other parameters may include polynomial coefficients in the case of a polynomial form of the function $G(\cdot)$. The step of fitting 105 is often called model estimation or training and is well known to those skilled in the art. Likewise, when other embeddings are used, one skilled in the art would readily recognize an alternative form of equation (A) that would be applicable in addition to the structural parameters involved.

There are a number of techniques for performing the step of fitting 105 that are generally applicable to a wide variety of embedding types. The techniques include, but are not limited to: (i) least-squares fitting with multivariate polynomials, (ii) fitting using other appropriate basis functions, such as radial basis functions, (iii) fitting using a neural network as a universal function approximator, (iv) fitting with local linear models, and (v) fitting with cluster-weighted models. In addition, there are many other techniques for fitting a function to data that may be used with the present invention. There may be advantages of using one of these methods over the others in specific practical situations. Such advantages and the correct choice of the function fitting method given a particular embedding should be obvious to one skilled in the art and are all within the scope of the present invention.

In the preferred embodiment, the least-squares fitting with multivariate polynomials technique is used with a lagged embedding. While least-squares (L-S) fitting with multivariate polynomials is generally applicable and generally the preferred technique, two cases are known to benefit from the use of alternate techniques. The first case is where clipping or sharp limiting of the output data 212 is observed for one or more of the output ports of the device. The second case is when it is found that a polynomial of degree 5 or less does not give an accurate enough fit for the application. The L-S fitting technique is relatively fast compared to some of the other techniques and, therefore, is preferred in most cases. The L-S fitting with multivariate polynomials technique is described further hereinbelow.

The method 100 further comprises the step of verifying 106 the fitted function $G(\cdot)$ using the second subset of the input data and the output data. The step of verifying 106 comprises the step of using the second subset of input data to produce a second embedded data set. The step of verifying 106 further comprises the step of using the first embedded data set and the second embedded data set in the fitted function $G(\cdot)$ to produce a first predicted data and a second predicted data, respectively. The step of verifying 106 further comprises the step of comparing the second predicted data from the function $G(\cdot)$ to the second subset of output data. The objective of the step of comparing is to determine if the predicted data is sufficiently similar to the second subset of the output data from the device. Whether the predicted data and the second subset of the output data are sufficiently similar will depend on the particular application and should be apparent to one skilled in the art. If the second predicted data and the second subset of the output data are sufficiently similar then the fitted function $G(\cdot)$ accurately mimics or is said to accurately model or predict the performance of the device. The verified fitted function $G(\cdot)$ then becomes the behavioral model of the nonlinear device in a discrete time representation.

In general, the definition of "sufficiently similar" will depend on the specific application of the present invention. However, two tests are typically performed to help verify 106 the fit of the function $G(\cdot)$. The first test assesses the absolute error between the second predicted data produced by the fitted function $G(\cdot)$ and measured data that makes up the second subset of output data. The second test assesses whether the function $G(\cdot)$ fits well to both the first and second embedded data sets with respect to the corresponding first and second subsets of the output data.

A first test that can be used to verify 106 the function $G(\cdot)$ is based on the root-mean-squared (RMS) error of the predicted data relative to the input signal power. As a rule of thumb, the RMS error of the predicted data usually should be 1–10% of the signal power of the input data 210. In this test, the RMS error of the first predicted data is compared to the power of the first subset of the input data. Likewise, the RMS error of the second predicted data is compared to the power of second subset of the input data. If the RMS error is greater than 10% of the signal power in either the first or second subset case, then the model is likely to be "underfitted" and the verification is considered to have failed.

In the second test the performance of the fitted function $G(\cdot)$ is compared between the first and second embedded data sets. As a rule of thumb, the fitted function is said to accurately model or predict the performance of the device if the RMS error associated with the second predicted data is less than or equal to three times the RMS error associated with a first predicted data utilizing the training data (i.e., first subsets). Generally, if the RMS error associated with the second predicted data is less than the RMS error associated with the first predicted data then the model is not considered validated. In fact, in most cases this condition indicates that the model is likely to be "overfitted".

The RMS error as used herein is the RMS difference between the predicted data given by $G(\cdot)$ and the corresponding portion of the measured data 212. The RMS error associated with the first predicted data is the RMS difference between a predicted output using the first embedded data set as an input to $G(\cdot)$ and the first subset of the output data. The RMS error associated with the second predicted data is the RMS difference between the predicted data produced using the second embedded data set as an input to $G(\cdot)$ and the second subset of the output data. The first predicted data is produced by applying the fitted function $G(\cdot)$ to the first embedded data set. One skilled in the art will recognize that there are numerous other criteria for verifying the fitted function G(·) in specific cases all of which are within the scope of the invention.

If the predicted data and the second subset of the output data are not sufficiently similar (i.e. either underfitted or overfitted) for the application then the present invention is a robust tool for examining and modifying the excitation signal 204, embedding type, structural parameters and other choices made in steps 101–105 in an iterative manner. Advantageously, steps 101–106 can be iteratively repeated until the predicted data and the second subset of the output data are rendered sufficiently similar to the artisan. For example, a determination often can be made whether the inaccuracy is due to an incorrect choice of fitted function and/or function parameters, inadequate coverage of the embedding space by the input signal 204, or an insufficiently large embedding space dimension. If it is determined that an incorrect choice of fitting function and/or function parameters has been made, such as having chosen a polynomial function with a degree that is either too high or too low, steps 105–106 may be repeated with different parameters. If there is inadequate coverage of the embedding space, a new input signal 204 can be constructed in the step of applying 101 and steps 102–105 can be repeated. If, on the other hand, the embedding space is insufficiently large or of an incorrect type, a new embedding space may be constructed in step 104 and steps 105 and 106 can be repeated. It is well within the scope of the invention and, in fact, a key feature of the invention, that the steps 101–106 of the method 100 can be applied iteratively until the skilled artisan is satisfied with the accuracy of the behavioral model produced.

For example, adequacy of coverage of the embedding space may be examined graphically using parametric multidimensional plots of subsets of input and output variables. A parametric plot of the first and second subsets of input data and output data can be generated and then examined to determine whether the first subsets fill the same volume on the plots as that filled by the second subsets.

In another embodiment of the method 100, the step of verifying 106 further comprises the step of converting the behavioral model from a discrete time representation to a continuous time representation. Converting from a discrete time representation to a continuous time representation is well known to those skilled in the art.

Figure 2:
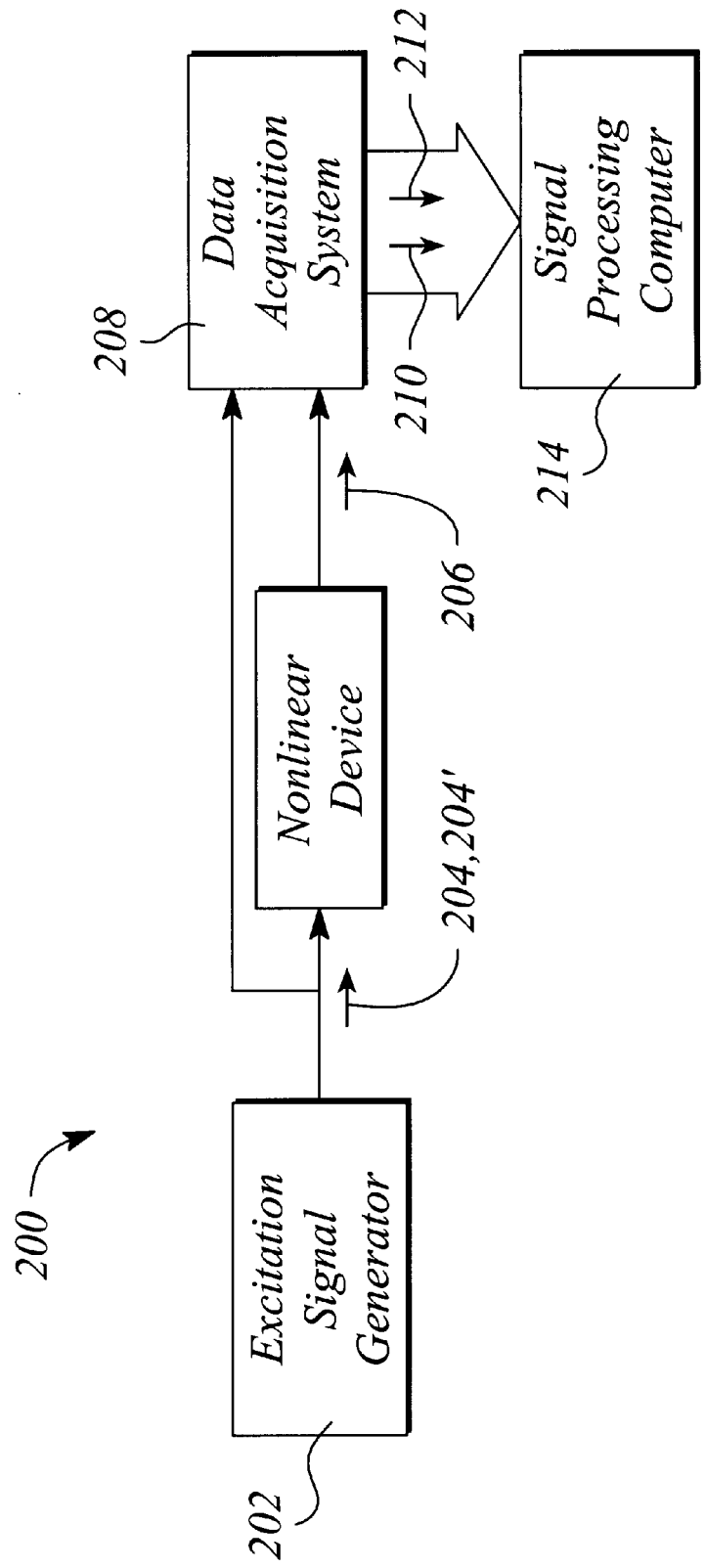
FIG. 2 illustrates a block diagram of the apparatus of the present invention.

The apparatus of the present invention is illustrated in a block diagram in FIG. 2. In accordance with the present invention, the apparatus 200 for producing a behavioral model of a nonlinear device from embeddings of time-domain measurements comprises an excitation signal generator 202 that produces an input signal or excitation signal 204. The excitation signal generator 202 can be a digital-to-analog converter (DACs), an arbitrary waveform generator (AWG), or a set of sine wave generators with amplitude and phase weighted outputs. Sine wave generators are especially useful at high frequencies (e.g. RF and above) where DACs and AWGs are difficult to find or do not exist. One skilled in the art will recognize that there are other means for implementing the excitation signal generator 202 besides those listed above, all of which are within the scope of the invention.

The input signal 204 is applied to an input port of the nonlinear device to produce an output signal 206 at an output port of the nonlinear device. While the input signal 204 can be any time-domain signal or combination of signals, preferably the input signal 204 is constructed in a manner that insures adequate coverage of the operational range of the nonlinear device both in terms of amplitude and in terms of frequency. The specifics of the construction of the preferred input signal 204 are described further herein below.

The apparatus 200 of the present invention further comprises a data acquisition system 208. The data acquisition system 208 samples and digitizes the input signal 204 and the output signal 206 to produce input data 210 and output data 212. The output data 212 represents a measured response of the device. The data acquisition system 208 can be constructed either using analog-to-digital converters (ADCs) or using traditional frequency domain or time-domain measurement systems. Examples of traditional frequency-domain measurement equipment include vector network analyzers or microwave transition analyzers with absolute power and phase calibration and software for reconstructing time-domain voltage and current waveforms from the frequency-domain measurements. This approach of frequency-domain measurement is generally required at high frequencies such as RF and above where it is costly or impossible to measure voltages and currents directly with ADCs. One skilled in the art will recognize that there are other applicable means for sampling and producing the input data 210 and the output data 212 for a given application of the apparatus 200, all of which are within the scope of the present invention.

The apparatus 200 of the present invention further comprises a signal processing computer or signal processor 214. The input data 210 and the output data 212 produced by the data acquisition system 208 are processed by the signal processing computer 214. First, the signal processor 214 separates the input data 210 and the output data 212 into first and second subsets. Second, the signal processor 214 utilizes the first subset of the input data 210 and the first subset of the output data 212 to construct an embedding space. Third, the signal processing computer embeds the first subsets in the embedding space as the first embedded data set. Fourth, the signal processing computer 214 fits a function to the first embedded data set in the embedding space. Then the signal processing computer 214 verifies the fitted function using the second subset of the input data and the second subset of the output data 212. The verified fitted function G(·) is the behavioral model of the nonlinear device. In another embodiment, the signal processing computer 214 further computes a continuous-time model from the discrete behavioral model produced by the fitted function G(·).

The discussion that follows concerns the details of practicing the present invention. While written for brevity for the method 100 the dicussion applies equally well to the apparatus 200 of the present invention.

The method of nonlinear model extraction used in the method 100 and apparatus 200 of the present invention is an innovative and non-obvious method based on "dynamic-reconstruction theory," which has its origins in the Takens's Embedding Theorem (F. Takens, *Dynamical Systems and Turbulence, Lecture notes in Mathematics* 898, ed. D. Rand and L. S. Young, Berlin: Springer-Verlag, 1981; and T. Sauer, J. A. Yorke, and M. Casdagli, "Embedology," *J. Stat. Phys.*, vol. 65, pp. 579–616, 1991). Dynamic-reconstruction theory has been extensively developed for modeling autonomous systems or devices, i.e. systems with no inputs or driving terms, by the scientific community since its introduction.

The existing dynamic-reconstruction theory is used to produce models of signals with nonlinear state space equations. These are represented by difference equations for discrete time of the form:

$$\vec{x}(n+1) = F(\vec{x}(n))$$

or differential equations for continuous time of the form:

$$\frac{d\vec{x}(t)}{dt} = F(\vec{x}(t))$$

where $\vec{x}(n)$ or $\vec{x}(t)$ is a d-dimensional state vector of the systems at time n or t respectively, and $F(\cdot)$ is a vector valued function. According to Takens's embedding theorem, the geometric structure of the multi-dimensional dynamics of such a system can be "unfolded" from the measurement of a single observable value of the system, $\vec{y}(n)$, in a D-dimensional state space with dimension D<2d. In practice, $\vec{y}(n)$ is constructed from a scalar time-domain signal by forming a time-delayed vector $$\vec{y}(n) = [y(n), y(n-q), \ldots, y(n-(D-1)q)]$$

The embedding theorem has a powerful implication as originally developed for undriven systems and signals. Namely, the evolution of points in the "reconstructed" state space follows that of the unknown dynamic in the original state space. In other words, a continuous path or trajectory in the reconstructed state space representing a time evolution of a signal produced by a nonlinear system or device is also a continuous path or trajectory in the original state space. Appropriately choosing an embedding space can remove all ambiguities or overlaps in the continuous path thereby making the fitting of a function to the continuous path a unique, unambiguous operation.

The first suggestion of using dynamic-reconstruction as a general approach to input/output modeling appears to have been made by Casdagli (M. Casdagli, "A dynamical systems approach to input-output systems," *Nonlinear Modeling and Forecasting,* vol. XII, *Santa Fe Institute Studies in the Sciences of Complexity,* eds. M. Casdagli and S. Eubank, Addison-Wesley, pp. 265–281, 1992). Casdagli extends the dynamic-reconstruction approach to driven or input/output devices or systems of the form $$\frac{d\vec{x}}{dt} = F(\vec{x}, \vec{u}), \vec{y} = h(\vec{x})$$

where $\vec{u}$ is a scalar or vector of external inputs, $\vec{x}$ is a state vector and $h(\vec{x}): \Re^a \to \Re^b$ is a function producing output vector $\vec{y}$. Dynamic reconstruction is extended to these input/output systems by considering the embedding of the inputs and the outputs in the form of equation (A) hereinabove.

Unexpectedly and advantageously, the embedding theorem thus extended can provide a general approach or solution to the problem of extracting black-box behavioral models for nonlinear devices directly from time-domain measurements. The basis of the present invention is the novel extension of the Takens's Embedding Theorem and the work of Casdagli to the problem of black-box behavioral model development from time domain measured data taken from nonlinear, driven or "input/output", devices or systems.

The present invention advantageously fits the function $G(\cdot)$ to the first embedded data set using standard nonlinear modeling methods, such as neural networks, radial basis functions, or global polynomials. Therefore, the larger problem of input/output behavioral modeling is reduced by the present invention to a number of smaller sub-problems. The sub-problems are (1) the design of appropriate excitation signals; (2) the determination of model structure or embedding space, (3) the determination of the function $G(\cdot)$ and its structural parameters (l, m, and τ, in the case of a purely lagged embedding), (4) the determination of model parameters implicit in the fitted function $G(\cdot)$ such as coefficients in the model class, for example polynomial coefficients if the fitted function $G(\cdot)$ is polynomial; and (5) model or fitted function validation. Although in practice, the approach to solving these sub-problems may depend strongly on the particular device being modeled, a general approach methodology for solving the sub-problems (1)–(5) is presented in the steps 101–106 of the method 100 using apparatus 200 of the present invention for all applicable devices.

According to the invention, a method 300 of constructing an input or excitation signal 204 to be applied to a nonlinear device for behavioral model extraction from embedded time-series measurements is provided also. As noted above, in principle, the input signal 204 can be any time-domain signal or combination of signals. However, in practice, the method 300 of constructing the input signal 204 is normally dependent on the characteristics of the nonlinear device. In particular, knowledge of the dynamic characteristics of the device or the physics of the device will often be considered in the construction or selection of the input signal 204. Therefore, according to conventional approaches, to construct an excitation signal 204 properly requires knowledge of the device's state space or an equivalent embedding space in addition to the operational amplitude and frequency ranges of the device. However, in accordance with the present invention, knowledge of the true characteristics of the device generally comes from the steps in the method 100 of the invention. Therefore, the method of constructing 300 an appropriate excitation signal 204 is often an iterative process as noted above. The excitation signal 204 is constructed in the excitation signal generator 202 of the apparatus 200 of the present invention.

In general, the method of constructing 300 the excitation signal 204 is based on the engineering assumption that a set of measurements for characterizing a device must fully exercise the region of interest in the state space of the device. Therefore, the method of constructing 300 can begin with an educated guess at what input variables and derivatives of these input variables are state variables of the device. These input variables and derivatives are referred to herein as the configuration space of the device. As mentioned above, an incorrect choice of the configuration space will be detected in the practice of the present invention because the resulting model will exhibit poor performance at the step of verifying 106. If a poor choice of the excitation signal 204 is determined to be causing unacceptably high errors at the step of verifying 106, the excitation signal 204 can be adjusted and the procedure repeated.

Once a set of input variables and their derivatives have been selected, or equivalently once a configuration space has been chosen, some limits on the input signal 204 must be usually be applied. From these limits, a subset of the configuration space is defined. This subset of the configuration space is what needs to be covered by the excitation signal 204 to adequately stimulate the device in order to produce an accurate model.

Typically, there are limits to the excitation amplitudes that can be applied to a device. For example, most electronic or electrical devices have a maximum voltage that can be safely applied across the device terminals. These limits translate directly into the choice of the configuration space. A maximum frequency at which the device will operate is also usually specified. This maximum operating frequency provides a limit or bounds on all time derivative of voltage since $$\max_t\left\{\frac{d^n[A(i)\sin(2\pi ft)+B]}{dt^n}\right\} =$$

$$\max_t\left\{(-1)^{\left(\frac{n}{2}\right)}A(i)(2\pi ft)^n\sin\left(2\pi ft - \chi_{odd}(n)\frac{\pi}{2}\right)\right\} = A(i)(2\pi ft)^n$$

where $$\chi_{odd} = \begin{cases} 1, & n \text{ is even} \\ 0, & \text{otherwise} \end{cases}$$

Figure 3:
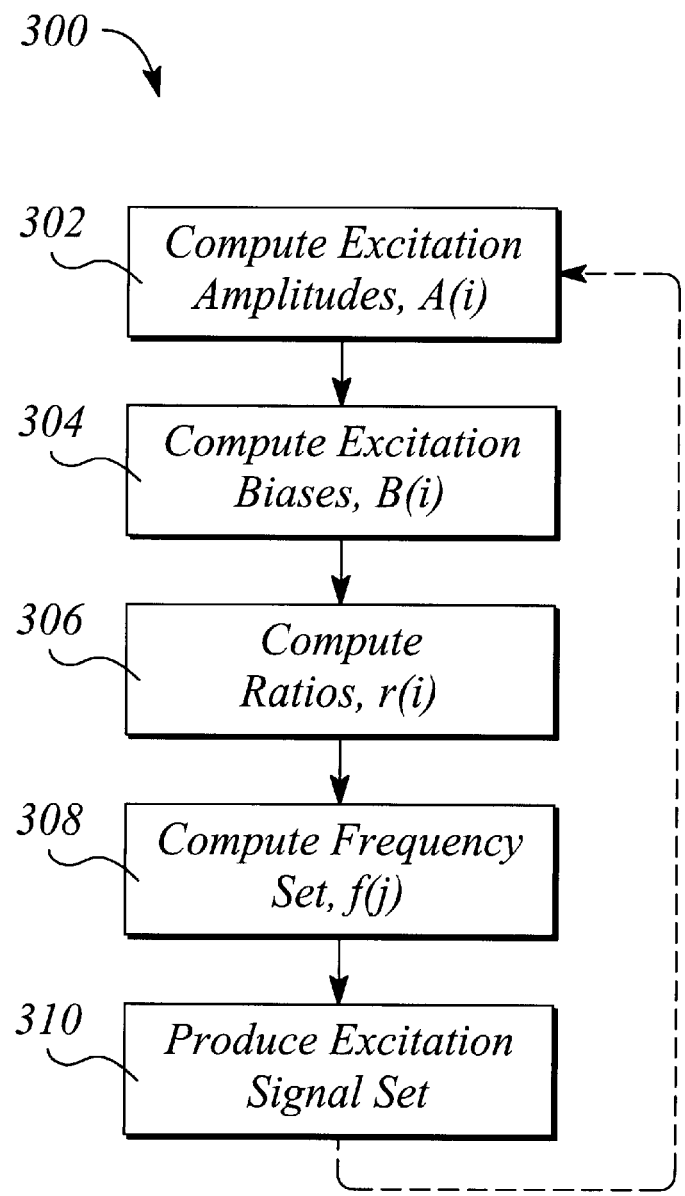
FIG. 3 illustrates a block diagram of the method of constructing an excitation signal in accordance with the invention.

A block diagram of the method of constructing 300 is illustrated in FIG. 3. The method of constructing 300 the excitation signal 204 comprises the step of computing 302 an excitation amplitude A(i) for each input port i of the device. The values of A(i) should be chosen to be as large as possible given the known limitations of the inputs of the device. Preferably, A(i) should be chosen such that $$A(i)=V(i)-v(i)$$

where v(i) and V(i) are the minimum and maximum allowed amplitudes of the ith input of the device respectively.

The method of constructing 300 further comprises the step of computing 304 an excitation bias B(i) for each input port i of the device. The bias B(i) is preferably chosen to be the mean of the minimum and maximum allowed amplitudes at the ith port given by $$B(i) = \frac{v(i)+V(i)}{2}$$

The method of constructing 300 still further comprises the step of computing 306 a ratio r(i) of the ith port according to $$r(i) = \begin{cases} 1 & \text{for } i=1 \\ \frac{p(2i-1)}{p(2i-2)} & \text{for } i>1 \end{cases}$$

where p(i), the ith prime number is defined as $$p(1)=1;\ p(2)=2;\ p(3)=3;\ p(4)=5;\ \ldots$$

An example set of ratios r(i) for a five port device is $$r(i) = \left\{1, \frac{3}{2}, \frac{7}{5}, \frac{13}{11}, \frac{19}{17}\right\}$$

The definition of r(i) given hereinabove is preferred because using it in conjunction with the method of constructing 300 given herein provides good coverage of the state space of the device without excessively increasing the maximum frequency that must be generated. Other definitions of r(i) may be readily developed by one skilled in the art and are all within the scope of the present invention.

The method of constructing 300 the excitation signal 204 still further comprises the step of computing 308 a set of frequencies given by $$f(j) = f(1) + \frac{f(j)-f(1)}{f(F)-f(1)};\quad j=2\ldots F-1$$

where f(1) is a lowest operational frequency of interest for the device and f(F) is a highest operational frequency of interest for the device. The value of F is chosen as a reasonable tradeoff between measurement time and model accuracy. A preferred value of F is ten. The lowest operational frequency f(F) of interest for the device refers to the lowest frequency at which the device is to be modeled which is generally greater than or equal to the lowest true operational frequency of the device. Likewise, the highest operational frequency f(F) is generally less than or equal to the highest true operational frequency of the device. However, if, the method of constructing 300 is being repeated at a given point in time because the step of verifying 106 failed, then the number of frequencies F should be increased from that which was used in the previous iteration.

Having chosen a set of frequencies f(j), the method of constructing 300 still further comprises the step of producing 310 a set of F excitation signals, each excitation signal 204 comprising i sub-signals, one for each of the i input ports of the device. The ith sub-signal of the jth excitation signal 204 is given as a function of time by $$s(i,j,t)=A(i)\sin(2\pi r(i)f(j)t)+B(i)$$

Therefore, a total of F input signals 204 are applied to the device and sampled and a total of F measurements of the device output are performed. The excitation signals 204 are sampled in the step of sampling 102 and outputs are measured in the step of measuring 103 for each of the F input signals 204.

The method of constructing 300 provides an excitation signal 204 composed of various sine waves. Preferably, the use of method 300 to construct the excitation signal 204 is limited to devices that have bandwidths greater than ten times a sampling frequency of the dual channel data acquisition system 208 used in the step of sampling, 102 and/or bandwidths greater than five times an analog bandwidth of the system 208.

In cases where the bandwidth of the device is less than ten times the sampling frequency of the system 208 and where the bandwidth of the device is less than five times the analog bandwidth of the system 208, another embodiment of the method of constructing the excitation signal 204' is preferably used instead of the method 300. In this embodiment, the method of constructing comprises the generation of a set of K uniformly distributed, pseudo-random noise (PN) sequences where K is equal to the number of input ports on the device. PN sequences are periodic sequences of random values. The excitation signal 204' is then the set of PN sequences with the members of the set scaled by the device input minimum/maximum amplitude limitations given by v(i) and V(i). A uniformly distributed PN sequence and methods for generating a uniformly distributed PN sequence are well known to those skilled in the art.

The PN sequences can be applied directly as an excitation signal 204' in the case of a baseband device. A baseband device is one that has an input operational frequency range with a low frequency end extending to zero Hertz. In practice, the PN sequences can be directly applied as an excitation signal 204' even when the device is only nearly a baseband device, that is when the low frequency end of the operational frequency range is nearly but not quite zero Hertz. When the device is a passband device or one in which the low end of the operational frequency range of the device is not at or near zero Hertz, then the PN sequence must be upconverted before it can be applied to the input of the device. The excitation signal 204' in the case of a passband device can be constructed by multiplying or mixing the PN sequences with a sine wave at or near a center frequency of the operational frequency range of the device. Finally, the PN sequences can be used on relatively narrowband devices by filtering the PN sequences with a sharp lowpass filter in the case of baseband devices or a sharp bandpass filter in the case of bandpass devices. The objective is to limit the spectral energy of the PN sequence based excitation signal 204' to be approximately the same as the bandwidth of the device. One skilled in the art would readily understand how to select and apply such filters in a given case.

In practice, combinations of sine waves, as described above in method 300, are chosen for constructing excitation signals 204 in many applications. Sine waves are simple to generate, amplify, and apply at all frequencies from mechanical or sub-audio, through audio, RF and microwave. However, at lower frequencies the excitation signal generator 202 (i.e. arbitrary waveform generators or computer-controlled digital-to-analog converters) of the apparatus 200 can be used to create excitation signals 204 having any shape whatsoever. The capability of the generator 202 to generate arbitrary waveforms can be used to reduce the number F of different excitation signals required by using excitation signals 204 that are more complex than sine waves. Fourier showed in the early nineteenth century that such excitations are sums of sine waves with various phases and amplitude weights applied to the individual sine waves. Therefore, steps 104 through 106 of the method 100 can be performed without modification with arbitrary excitation signals 204, as well as with sine waves. Consequently, the use of excitation signals 204 other than sine waves may reduce the number of experiments to be performed, or equivalently the number F of different excitation signals 204, but does not otherwise affect the operation of this invention.

There are situations within the scope of the present invention where it is difficult or impossible to apply an arbitrary excitation signal 204 to the device because the device can only be measured while it is being used in normal operation. A motorized vehicle, such as an automobile, that is driven on a road is an example of one such device. The input to the vehicle is limited to those produced by the driver or vehicle operator. Since the vehicle must remain on the road for the vehicle to remain operational, neither a set of sine waves nor another a pre-designed, arbitrary excitation signal 204 can be used. The vehicle example is one wherein the operational requirements of the device place constraints on the type of excitation signal 204 beyond such things as amplitude and frequency noted hereinabove. The preferred excitation signal 204 in this situation is one that includes operating the device near all of its performance limits. For the motorized vehicle, these limits might include limits in accelerations, speed, cornering and direction of travel.

In the method 100 of the present invention, the step of applying 101 the excitation signal 204 to a device is followed by the step of sampling 102 the input signal 204 to produce input data 210 and the step of measuring 103 the response of the device to the excitation signal 204 to produce output data 212. The steps of sampling 102 and measuring 103 are performed at discrete time intervals using the data acquisition system 208 of the present apparatus 200. It is well known by those skilled in the art that typical measurements for electronic devices include electrical values such as voltages, currents, incident and reflected power waves at various frequencies. Typical measurements for mechanical or hydraulic devices including but not limited to the motorized vehicle example, are temperature, pressure, volumes, positions, speeds, and accelerations. For example, measurements taken on the vehicle might comprise driver inputs such as steering wheel position, brake pressure, throttle position, gear selection and the response of the vehicle including speed, lateral and longitudinal acceleration, and yaw rate. In the preferred embodiment of the present invention, the input signal 204 to and the response or output signal 206 of, the device are sampled 102 and measured 103 by sampling and digitizing using system 208 with an appropriate sample rate or sample interval $\Delta t$. One skilled in the art would recognize that there are many approaches to sampling an input signal 204 and measuring an output signal 206 of a device and without undue experimentation would be able to choose an appropriate system 208 for a given device or class of devices.

In the preferred embodiment of the method 100 of the present invention, the steps of sampling 102 and of measuring 103 are followed by the step of filtering 103a the sampled and measured results to remove unwanted noise. The step of filtering 103a is also called the step of de-noising since the affect is to reduce or eliminate noise introduced by the step measuring 103. Often it is only necessary to apply the step of filtering 103a to the measured data 212 produced by the step of measuring 103.

It is well known by those skilled in the art that after measurements are taken, the data produced by these measurements may be contaminated with excessive noise. When working with linear devices, linear lowpass filters are often used to remove high frequency noise. However, using linear filters, such as a linear lowpass filter, may not be desirable when dealing with noise corrupted data from nonlinear devices. Due to the nature of nonlinear devices, their output signals 206, even without noise, may have spectral components at much higher frequencies than those of the inputs. The high frequency components present at the output of a nonlinear device are often referred to as spurious responses and are a direct result of the nonlinear performance of the device. Preserving these spurious components in the measured data is desirable in the operation of the present invention. If conventional linear lowpass filters were to be used for removing unwanted noise, the passband of the lowpass filter would have to be wide enough to preserve the spurious response produced by the nonlinear device. This could significantly reduce the effectiveness of the linear filter's ability to reduce noise. In addition, if ADCs are used in the system 208 to collect the data in the steps of sampling 102 and measuring 103, much higher than necessary sample rates would be required to cover the entire passband of the lowpass filter.

Therefore, while linear filtering may be acceptable for filtering the data produced by the step of sampling 102, preferably nonlinear filters are used for the step of filtering 103a or de-noising of the data produced by the step of measuring 103. Applicable nonlinear filters include median filters and morphological filters. Nonlinear filters of these and other types are generally better able than linear filters to remove most of the noise in a signal produced by a nonlinear device while maintaining the bona fide abrupt amplitude swings and sharp edges characteristic of the output signals 206 of such devices.

Morphological filters are based on geometric growing and shrinking operations. The growing operation can be thought of as smoothly padding a geometric shape, called a structure element, above and tangent to the signal being filtered. The output of the growing operation is a locus of points traced out by the top of the structure element. The shrinking operation is similar to the growing operation. The structure elements for the growing and shrinking operations should generally be chosen with some a priori knowledge about the shapes of features of interest in the signal being filtered (e.g. location and magnitude of spurious responses). The structuring elements often resemble these feature shapes. If one has no a priori knowledge about interesting or important feature shapes, it is difficult or impossible to choose a reasonable structuring element and therefore, it is advantageous to use a different class of nonlinear filter, such as the median filter. Like the morphological filters, median filters preserve sharp edges and do not ring. The construction of a median filter is relatively simple: replace a sample or data point in a sequence representing the signal being filtered by the median of the data point values surrounding it.

Further, in accordance with the invention, the step of creating 104 a first embedded data set involves operations that transform the first subset of input data and the first subset of output data into a new, usually expanded, first embedded data set by applying selected, linearly independent functions to the first input data subset and/or the first output data subset. In the preferred embodiment, the linearly independent functions defined by a choice of the embedding type are either lags of the input and output data (210, 212) or combinations of lags and wavelets.

As described above, the step of creating an embedded data set 104 comprises the steps of determining the embedding type and dimension followed by embedding the data. In the case of a lagged embedding, the step of determining the embedding dimension involves the selection of values for the structural parameters of equation (B), namely the determination of values for l, m and τ. The preferred method for determining l and m comprises using the method of false-nearest-neighbor originally developed for autonomous systems, those for which u(t)=0, by Kennel (Kennel et al, Phys. Rev., A 45, pp. 3404, 1992). The lag parameter τ is preferably determined by calculating the first zero of the mutual information of the observed input and output variables and taking a multiple of the sample time closest to the minimum of this set. This is the procedure used by Fraser (Fraser et al. Phys. Rev., A 33, pp. 1134, 1986). The method of false-nearest-neighbor may also be used for other embedding types. For all embedding types, the dimension of the embedding is determined by making an assumption of the dimension, examining the ramifications of using that dimension and possibly increasing the dimension in an iterative manner until acceptable results to the artisan are observed. The discussion below focuses on the lagged embedding. Equivalent processes with alternative embedding types should be readily apparent to one skilled in the art and are within the scope of the invention.

The method of false-nearest-neighbor for determining l and m in the case of a lagged embedding type comprises the steps of picking a point in the reconstruction state space or embedding space, finding the nearest neighbors to that point and determining if these neighbors are true or false neighbors. A point for the purposes of this discussion corresponds to an embedded data sample associated with a specific time t. Therefore, for a given m and l, let $$\epsilon_{l,m}(t) = [y(t-\tau), \ldots, y(t-l\tau), u(t-\tau), \ldots, u(t-m\tau)]$$

be a point defined by t. Examine other points in the reconstruction space $\epsilon_{l,m}(\bar{t})$ defined at other times $\bar{t}$ that minimize the Euclidean distance $\hat{d}$ given by $$\hat{d} = \|\epsilon_{l,m}(t) - \epsilon_{l,m}(\bar{t})\|_2$$

where the operator $\|.\|_2$ is the 2-norm defined on the embedding space. If the two points satisfy $$\frac{y(t) - y(\bar{t})}{\hat{d}} \geq R \qquad (C)$$

then the two points are true nearest neighbors in the dimension l and m. Otherwise, the point $\epsilon_{l,m}(\bar{t})$ is a false nearest neighbor. The value of R depends on the desired accuracy of the model being developed. Preferably, a value of R should be in the range of 1–2% of the relative signal size. Nearest neighbors are examined using equation (C) for all points in the embedded data set for a given, fixed l and m. A percentage of points with false nearest neighbors is calculated. If the percentage of false nearest neighbors is small (typically<1%), the examination process is stopped and the embedding dimension is given by l and m. If the percentage of false nearest neighbors is not small, repeat the process of nearest neighbor examination for a larger value of l and/or m.

In some cases, the data in the first input data subset and the first output data subset are oversampled. Oversampled means that the sample interval is much smaller than would normally be necessary according to standard engineering practices. The result of oversampling is the introduction of a statistical correlation between adjacent data samples, which introduces errors. In these cases, the samples can be de-correlated by defining a minimal time jΔt. This minimal time can be used to then select a new subset of the input data 210 subset and the output data 212 subset to which the above referenced step of creating an embedded data set 104 can be applied.

The lag parameter τ can be calculated by a number of methods, however, two methods are preferred. The first method of calculating τ is to use a simple linear statistic, the mean subtracted autocorrelation, namely $$c_v = \frac{1}{\sigma^2}\langle (s_n - \langle s_n \rangle)(s_{n-v} - \langle s \rangle) \rangle = \frac{\langle s_n s_{n-v} \rangle - \langle s \rangle^2}{\sigma^2}$$

where $$\sigma^2 = \langle (s - \langle s \rangle)^2 \rangle = \int_{-\infty}^{+\infty} ds'(s' - \langle s \rangle)^2 p(s')$$

and where the operator $<.>_b$ denotes the time average of the argument.

The autocorrelation measures the similarity of the signal $s_n$ and its phase shifted replica $S_{n-v}$. The lag parameter τ is determined by the first zero of the autocorrelation function, that is the first value of the phase shift v for which $c_v$ is zero.

The second method of calculating the lag parameter τ is to use the nonlinear statistic called the mutual information of the signal advocated by Fraser. The mutual information of the signal for a given lag parameter τ is given by $$I(\tau) = \sum_{i,j} p_{i,j}(\tau) \ln p_{i,j}(\tau) - 2 \sum_i p_i \ln p_i$$

where $p_i$ denotes the probability that the signal is in the ith bin of a histogram and $p_{i,j}(t)$ is the probability that s(t) is in bin i and s(t+τ) is in bin j. The first minimum of l(τ) is taken as the lag parameter τ. The minimums of l(τ) are indications of where the signal redundancy is minimized.

Lagged embeddings, those that utilize lags of the input data 210 and/or output data 212 samples as described hereinabove, are sufficient for many applications. The reason lagged embedding are so broadly applicable is that a wide variety of functions can be approximated using lags of the available data. Functions that can be approximated by lags include derivatives, integrals, and other transformations of lagged variables. For instance, to calculate the derivatives and integrals, three sequential time points, $S(t_1)$, $S(t_2)$, $S(t_3)$, are used for the local interpolation by a second order polynomial where $S(\cdot)$ refers to a selected data set (input data 210 or output data 212) and $t_n$ refers a selected point within the time-series represented by the data. Therefore, the first derivative with respect to time, assigned to the time point $t_2$, and second derivative with respect to time, assigned to the time $t_3$ are approximated by the following functions of lags $$\frac{df}{dt} \cong f(t_2) - f(t_1)$$

$$\frac{d^2 f}{dt^2} \cong f(t_1) - 2f(t_2) + f(t_3)$$

Integral and double integrals are another example of functions that can be approximated with lagged embedding. Generally speaking, any function of lagged variables $G(f(t_1), f(t_2), f(t_3))$ may be used for a lagged embedding. The only requirement is that if one uses a set of embedding functions, the functions used should be linearly independent.

A variety of alternative embedding types based on both linear and nonlinear transformations of the samples and/or measured data have been developed and are useful in specific situations.

In accordance with the method 100 of the present invention, the step of fitting 105 a function is often called model estimation or training. There are a number of methods for performing the functional fitting in the embedding space including but not limited to: least-squares fitting with multivariate polynomials (described in more detail below); other appropriate basis functions, such as radial basis functions; using a neural network as a universal function approximator; local linear models; and cluster-weighted models.

Any of these and many other similar methods for approximating a function from data may be used in the step of fitting 105 of this invention. There may be advantages of using one of these methods over the others in specific practical situations. Such advantages and the correct choice of a function fitting method would be obvious to someone skilled in the art of applied mathematics or in the art of statistical data fitting.

An example of fitting a function 105 of the preferred embodiment of the present invention using the method called least-squares (L-S) with multivariate polynomials of the desired degree follows. This approach is often called the principle component method (PCM). First a set of basis functions $\{f_j|j=1, \ldots, M\}$ is chosen for the multivariate polynomials of the desired degree with N defined as the number of embedded data points. If delay embedding is used, N will be less than the number of data points contained in the first subsets of the data. Second, $\vec{e}_i$ is defined to be the ith embedded datum. In the case of lagged embedding with sample time $\Delta t$ then the (k+m) element vector is given by $$\vec{e}_{i-max(k,m)+1} = [\vec{y}(i\Delta t - \tau), \ldots, \vec{y}(i\Delta t - (k-1)\tau), \vec{u}(i\Delta t - \tau), \ldots, \vec{u}(i\Delta t - (m-1)\tau)]^T$$

Third, a matrix A is defined that is obtained by evaluating the basis functions at the embedded data points, i.e. its (i, j)-th element is $f_j(\vec{e}_i)$. Fourth, a matrix Y is defined to be the matrix of lagged output data 212, i.e., its (i,j)-th element is the value of the jth output at the time associated with $\vec{e}_i$. That is $$Y = \begin{bmatrix} y_1(\max(k,m)\Delta t) & y_2(\max(k,m)\Delta t) & \ldots & y_b(\max(k,m)\Delta t) \\ y_1((\max(k,m)+1)\Delta t) & y_2((\max(k,m)+1)\Delta t) & \ldots & y_b((\max(k,m)+1)\Delta t) \\ \vdots & \vdots & & \vdots \\ y_1((\max(k,m)+N+1)\Delta t) & y_2((\max(k,m)+N+1)\Delta t) & \ldots & y_b((\max(k,m)+N+1)\Delta t) \end{bmatrix}$$

where b is the dimension of the vector of measurements of y.

Then, the least squares problem to be solved is to find coefficients C that minimize $\|AC - Y\|_2$ where $\|.\|_2$ is the standard 2-norm. The conventional method of performing this minimization involves computing the QR decomposition or Singular Value Decomposition (SVD) of A. The QR and SVD methods handle the numerical degeneracy typical of A well. However, the QR and SVD methods require storing and factoring the N×M matrix A. The difficulty is that when performing NLTSA, N typically increases exponentially with the embedding dimension D. Even storing A in main memory can be impractical when N exceeds a hundred thousand.

The difficulty of storing and factoring A can be avoided by solving the least squares problem using the normal equation approach. The normal equations are explicit equations for computing $C:C=(A^T A)^{-1} A^T Y$. The key observation is that these equations can be solved without ever explicitly forming and storing A. This is done as follows. First, the matrix $A^T Y$ is computed, whose (i,j)-th element is $$\sum_{k=1}^{N} f_i(e_k) y_{k,j}$$

Second, $A^T A$ is computed directly where the (i,j)-th element is given by $$\sum_{k=1}^{N} f_i(e_k) f_j(e_k)$$

Note that $A^T A$ is an M×M matrix which is much smaller that the N×M matrix A because, in practice, M<<N). This step requires computer time proportional to $NM^2$. Third, C is computed by first finding the diagonal matrix D of eigenvalues and orthogonal matrix V of eigenvectors of $A^T A$. D is ordered with descending, non-negative diagonal elements (i.e. $D_{11} \geq D_{22} \geq \ldots \geq D_{MM} \geq 0$). Second, an appropriate, small, positive value $\epsilon$, is chosen whose selection trades off accuracy of fitting against numerical stability. Let $\hat{D}_{ii}$ be the diagonal matrix with $$\hat{D}_{ii} = \begin{cases} 0 & \text{if } D_{ii}/D_{11} < \epsilon \\ 1/D_{ii} & \text{otherwise} \end{cases}$$

The new diagonal matrix $\hat{D}$ is substituted for the original diagonal matrix, D, in the formula for inversion of $$A^T A : (A^T A)^{-1} \sim V \hat{D} V^T$$

so that finally, C is given by $$C = V \hat{D} V^T (A^T Y)$$

The above described L-S method can be used in the case where the number of data points N in the input and output data subsets 210, 212 is so large that A cannot be stored in the available memory, whereas the commonly used methods of QR decomposition and SVD cannot. Both the normal equation method and the other methods require computer time proportional to $NM^2$, so neither have a significant advantage over the other based on computation time.

A behavioral model of a bipolar junction transistor (BJT) was created using the apparatus 200 and method 100 of the present invention and it is described below. This example is illustrative only and it is not intended to limit the scope of the invention in any way. For the example, the base of the BJT is designated as the input port and the collector of the BJT is designated as the output port. The emitter of the BJT is connected to ground that is also used as a reference for all voltages in the example.

An excitation signal generator 202 made using an arbitrary waveform generator (AWG) with an internal digital to analog converter (DAC) was programmed to generated an input signal 204 that was made up of a sequence of 20,000 voltage values at a rate of 8,000 voltage values per second. The input signal 204 was applied 101 to the base of the BJT. The voltage values programmed into the DAC were also stored in a computer memory as the input data 210 set. The device response signal 206 to the input signal 204 was measured 103 by sampling the output signal 206 at the collector of the BJT with an analog-to-digital converter (ADC). The output signal 206 was sampled at a rate of 8,000 samples per second. The sampled data sequence consisting of 20,000 BJT collector voltage values was stored in the computer memory as the output data 212 set. The collected input data 210 and output data 212 was then processed by a signal processing computer 214 to produce a behavioral model of the BJT. The signal processing computer 214 processed the input data 210 and output data 212 by executing a computer program that embodied the steps 103a–106 of the method 100 of the present invention.

Figure 4:
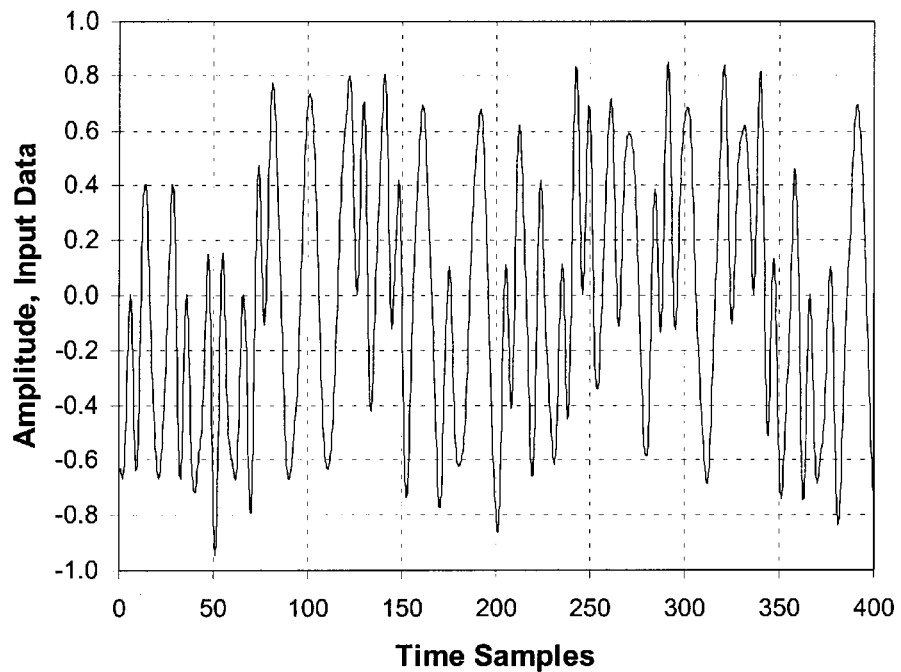
FIG. 4 illustrates a plot of a portion of the input data for a bipolar junction transistor example.
Figure 5:
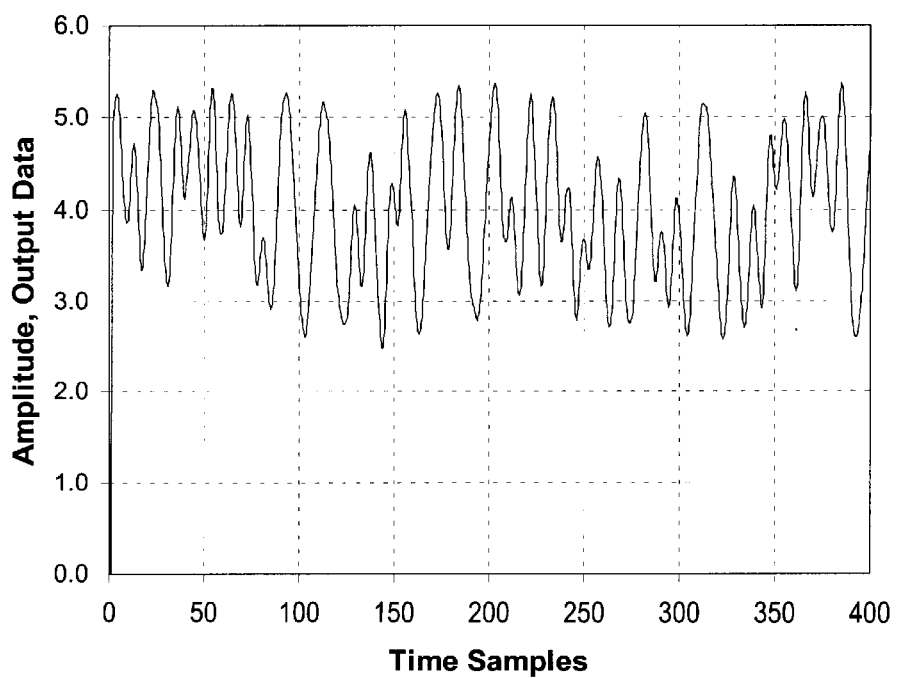
FIG. 5 illustrates a plot of a portion of the output data for the bipolar junction transistor example.

The input signal 204 for the BJT example was a PN sequence of length 10,000. The amplitude of the PN sequence was constrained to be in the range of $\{-1V, +1V\}$ (i.e. v(1)=−1 volt and V(1)=+1 volt). The PN sequence generated was uniformly distributed in a frequency range of 1–200 Hz. The PN sequence was created by using a high quality computer based random number generator to produce a sequence of random values and then bandlimiting the sequence using a bandpass filter between 0–200 Hz constructed from a high-order FIR filter like that used in the CDMA IS-95 specification. A portion of the input signal 204 used and an associated portion of the output signal 206 produced by the BJT is illustrated in FIG. 4 and FIG. 5, respectively.

A dialog box of a computer program used for defining the input signal 204 of this example is illustrated FIG. 6. In the dialog box, the PN sequence is referred to as a Pseudo CDMA (Code Division Multiple Access) signal. The dialog box used in this example also allows up to three sine waves to be used along with the PN sequence. The amplitudes of the sine waves were set to zero for the purposes of this example resulting in an input signal 204 that included only the defined PN sequence. A constant bias offset, set to zero for this example, is also provided for by the dialog box.

The input data 210 and the measured output data 212 were divided into first subsets and second subsets. For the BJT example presented herein, the first data subset of the input data corresponded to half of the available input data 210 and included data from sample time point 176 to the sample time point 9642. A corresponding set of time samples from the output data 212 was used to constitute the first subset of the output data.

Figure 7:
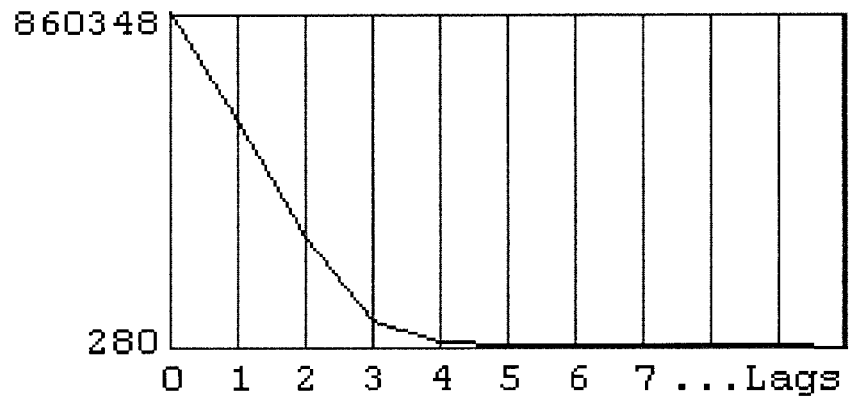
FIG. 7 illustrates a plot of the number of false nearest neighbors as a function of the number of lags for the bipolar junction transistor example.

For this BJT example, the method of false nearest neighbor described hereinabove was then used to determine a reasonable embedding dimension for the output signal 206. FIG. 7 illustrates a plot of the number of false nearest neighbors or internal dimension as a function of the number of lags. As can be seen in FIG. 7, the number of false nearest neighbors is reduced to essentially zero for lags of four or more. The method of false nearest neighbors is only one of several methods, including trial and error that can be used to determine an appropriate embedding dimension.

Figure 8:
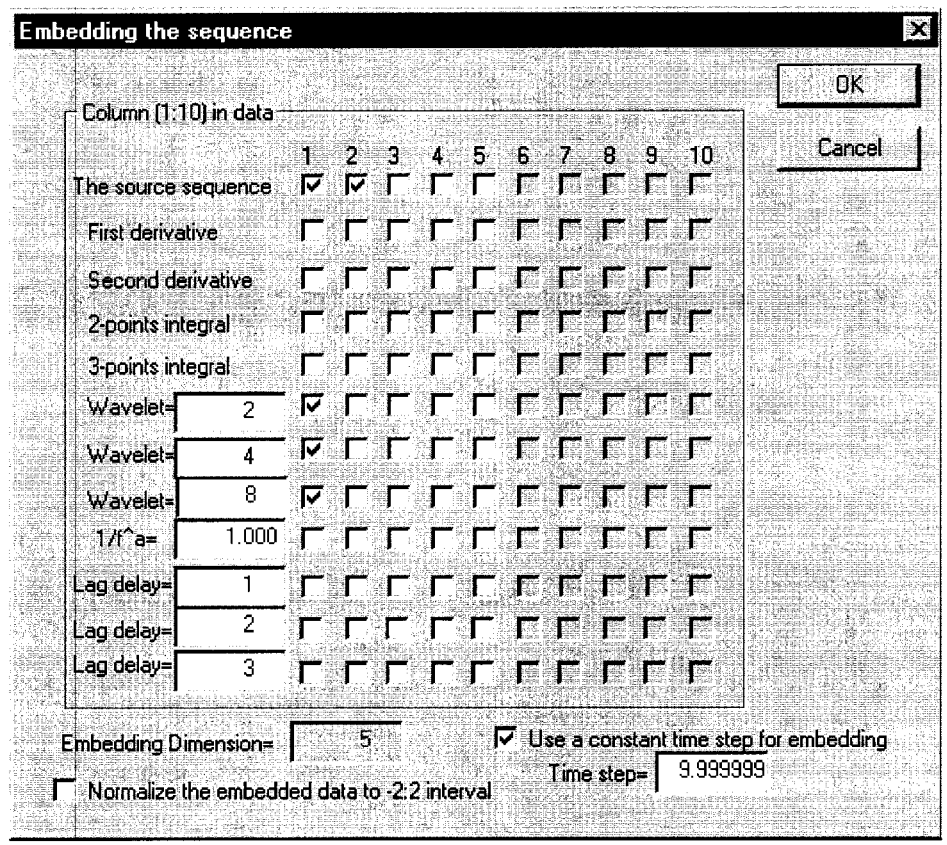
FIG. 8 illustrates a dialog box used to define the embedding type for the bipolar junction transistor example.

Following the estimation of the internal dimension, three additional (derivative) signals were calculated based on the input signal 204 by using the wavelet kernels 2, 4, and 8 wavelets implemented in a computer program used for the BJT example. A dialog box that lists the available embedding functions implemented in the computer program for this example is illustrated in FIG. 8.

Figure 9:
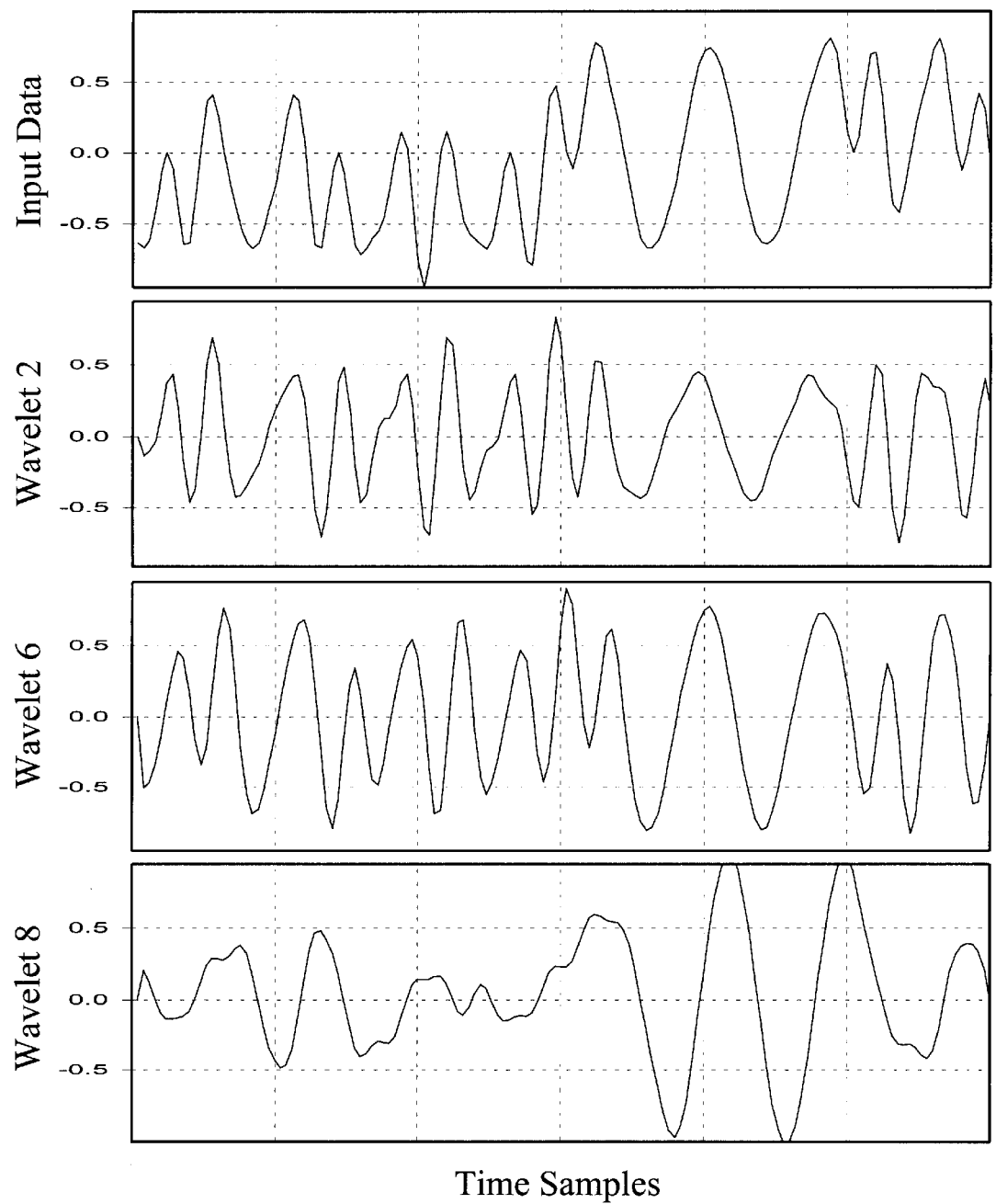
FIG. 9 illustrates a portion of the embedded data produced by embedding, which is divided into four separate parts for the bipolar junction transistor example.

The dialog box allows the selection of the embedding functions that are to be applied to the first subset of the input data and the first subset of the output data in the production of a first embedded data set. The functions listed in the dialog box correspond to specific functions en, as described hereinabove. The first embedded data set included the first subset of the input data as indicated by the checkmark in columns 1 of the dialog box illustrated in FIG. 8. In addition, the first embedded data set included data produced from the input data by applying each of a 2, 4, and 8 wavelet transformation to the first subset of the input data. As a result of this embedding there were 4 parts to the embedded data: (1) the first subset of the input data, (2) a 2-wavelet transformation of the input data, (3) a 4-wavelet transformation of the input data, and (4) an 8-wavelet transformation of the input data. FIG. 9 illustrates a plot of portions of each of these four parts of the embedded data set 213 produced by the selected embedding for the BJT example. Only a portion of the total embedded data set 213 produced is shown in the figure for clarity.

After the embedded data set 213 was created 104, a function was fit to the data with the step of fitting 105. The step of fitting 105 a function in the BJT example was accomplished with a least squares fitting to a multivariate polynomial. The function fitting (step 105) was accomplished in a point to point manner or mapping. In the case of the BJT example, the function fitting (step 105) utilized the first subset of the input data and the wavelet transformed data, parts (2)–(4), as input values for fitting and the measured first subset of the output data as a comparison to the predicted values produced by the function being fitted. The fitted function is also referred to as a polynomial map in as much as it "maps" the input data and embedded input data, parts (1)–(4) into a prediction of the output data using a polynomial function.

The average deviation of the measured values of the output data 212 from the corresponding predicted value produced by the fitted function is called "deviation" and it is the main parameter which evaluates the success of the whole procedure during the development of the black box model of the device. In general, the polynomial map that minimizes the deviation is not necessarily the best polynomial map. For example, a polynomial order can be chosen that is so high that the number of terms (and correspondingly the number of parameters for the black box model) is equal or exceeds the number of measurements itself. In this case, some polynomials can yield a "zero deviation" solution. Therefore, to get an accurate model, a more sophisticated approach than simply minimizing the deviation must be used. The approach used in the present invention is embodied in the method 100 in the step of verification 106 of the present invention.

Figure 10:
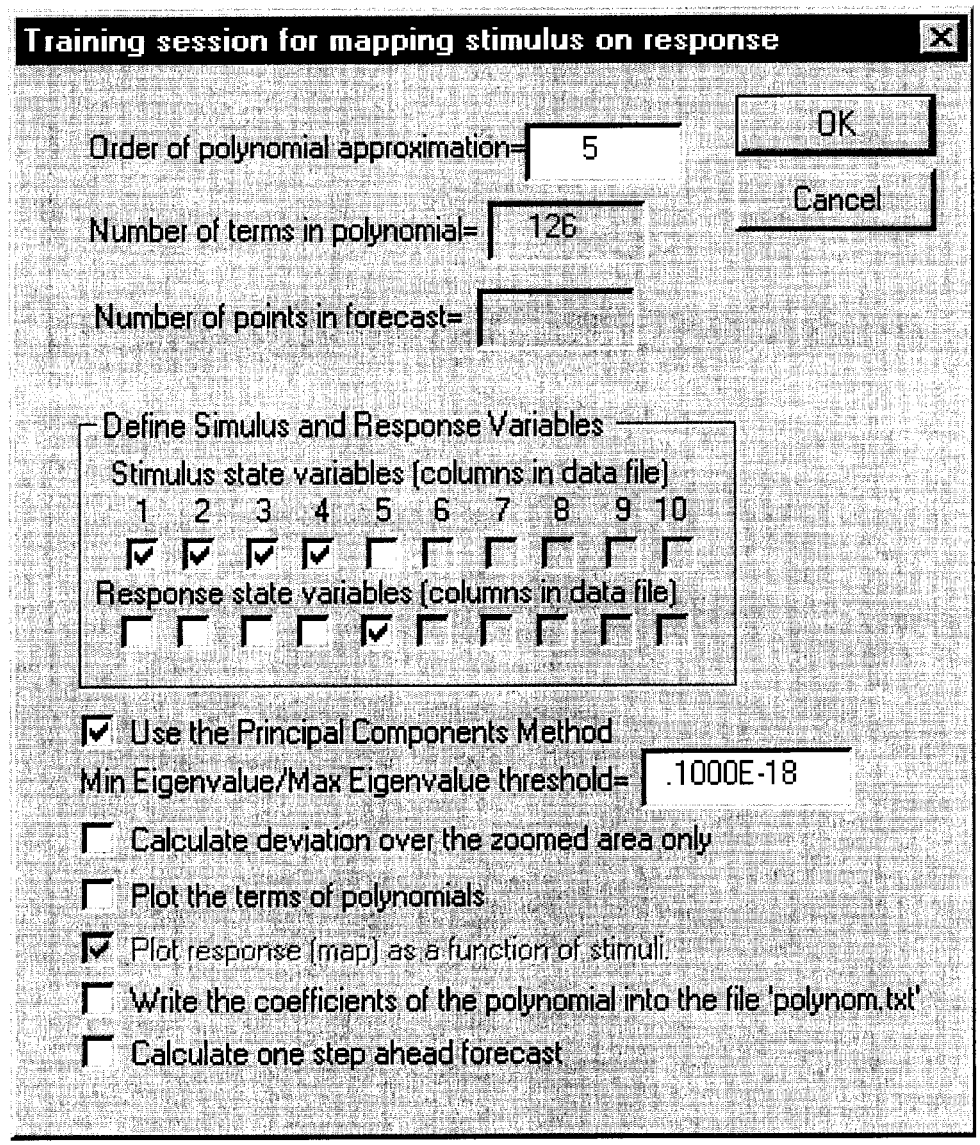
FIG. 10 illustrates a dialog box used to specify parameters associated with the step of polynomial fitting used in the bipolar junction transistor example.
Figure 11:
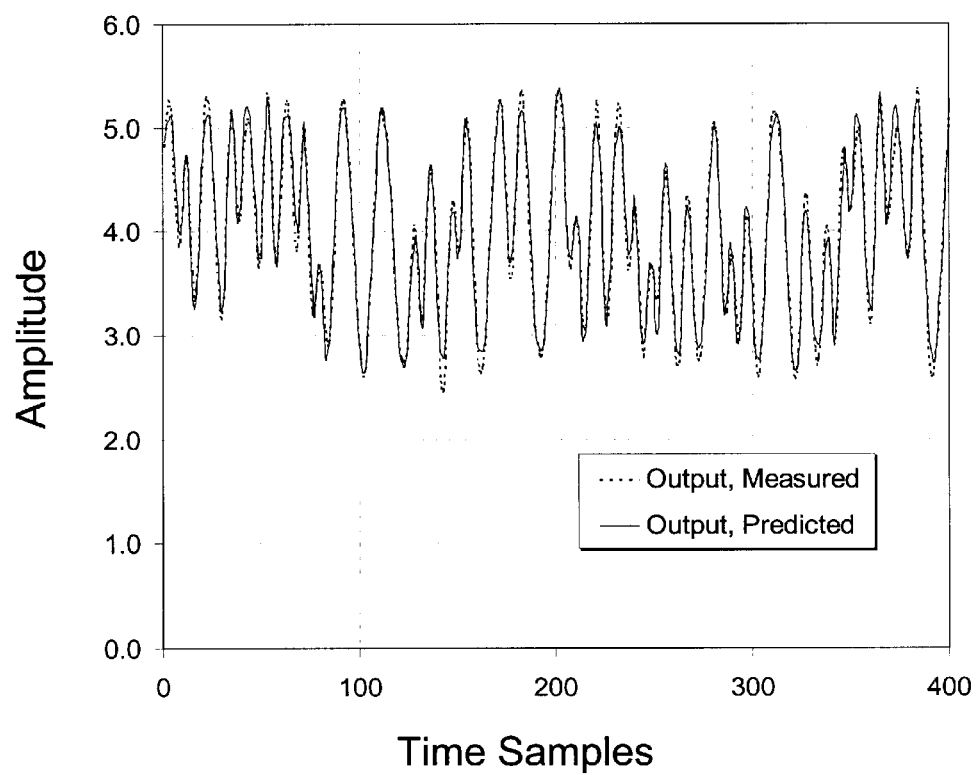
FIG. 11 illustrates a plot of the comparison of the measured output and predicted response produced for the bipolar junction transistor example.

The computer program used in the BJT example provides a dialog box to assist in the L-S multivariate polynomial function fitting process. FIG. 10 illustrates the dialog box utilized in the BJT example. A polynomial of order 5 was chosen. The original input data along with the three wavelet embedded data sets were designated as inputs to the polynomial function and the measured first subset of the output data was designated as the response data for use in the L-S process. In addition, the principal components method was chosen. The result of the fitting process is illustrated in FIG. 11 which is a plot comparing the predicted data produced by the fitted $5^{th}$ order polynomial to the first subset of the output data as a function of time. In the illustrated plot, the dashed line represents the measured first subset of the output data and the solid line represents the predicted data. There is very good agreement between the predicted data and the first subset of the output data.

The coefficients of the polynomial were saved in a file, to be used as a polynomial black box model of the BJT device. The following is the polynomial calculated for the black box behavioral model of the BJT transistor of this example:

$3.980667877363320 - 7.896498597432142E - 001*v1 -$ $3.665585450869457E - 001*v1*v1 - 7.112236556643211*v1*v1*v1 +$ $2.501831726751789*v1*v1*v1*v1 +$ $12.215150570587870*v1*v1*v1*v1*v1 + 2.079911943056558*v2 +$ $4.891939518777235E - 001*v1*v2 +$ $16.180939878427130*v1*v1*v2 -$ $6.373803999222218*v1*v1*v1*v2 -$ $55.140018310645250*v1*v1*v1*v1*v2 -$ $2.404018036290267E - 001*v2*v2 - 14.446749342336260*v1*v2*v2 +$ $6.510613064063364*v1*v1*v2*v2 +$ $96.307211278952310*v1*v1*v1*v2*v2 + 1.921257469043439*v2*v2*v2 -$ $3.513218328654148*v1*v2*v2*v2 -$ $77.888087324441590*v1*v1*v2*v2*v2 + 8.574613137448068E -$ $001*v2*v2*v2*v2 + 35.113817098024810*v1*v2*v2*v2*v2 -$ $5.743404462439912*v2*v2*v2*v2*v2 - 8.574434293365982E -$ $001*v3 + 2.073473002362789E - 001*v1*v3 +$

-continued $10.233045779267950*v1*v1*v3 - 4.111995841266435*v1*v1*v1*v3 -$ $32.335288970292820*v1*v1*v1*v1*v3 - 7.971206195827563E -$ $002*v2*v3 -10.603798957973140*v1*v2*v3 +$ $7.491387667079835*v1*v1*v2*v3 +$ $90.426919343524790*v1*v1*v1*v2*v3 + 7.070705577602169*v2*v2*v3 -$ $4.653278068108193*v1*v2*v2*v3 -$ $100.848222710534200*v1*v1*v2*v2*v3 +$ $1.147863373405016*v2*v2*v2*v3 +$ $39.476675838030130*v1*v2*v2*v2*v3 -$ $11.386871650858210*v2*v2*v2*v2*v3 - 1.172719917361746E -$ $001*v3*v3 - 5.791427212485587*v1*v3*v3 +$ $2.880567672254983*v1*v1*v3*v3 +$ $46.656706054503280*v1*v1*v1*v3*v3 + 7.724917728507990E -$ $001*v2*v3*v3 - 3.491721712817707*v1*v2*v3*v3 -$ $86.992593492564080*v1*v1*v2*v3*v3 +$ $1.277371388543998*v2*v2*v3*v3 +$ $63.891840890386450*v1*v2*v2*v3*v3 -$ $7.454699677682015*v2*v2*v2*v3*v3 + 4.070525693187506E -$ $001*v3*v3*v3 - 7.780535073948158E - 001*v1*v3*v3*v3 -$ $28.124627527133270*v1*v1*v3*v3*v3 +$ $3.756441740995342E - 001*v2*v3*v3*v3 +$ $29.327204403415640*v1*v2*v3*v3*v3 -$ In some cases, the experimental errors involved in the measurements can result in an overfitted model. This situation is detected in the step of verifying 106 if the model errors are not approximately equal to the measurement errors. The overfitting criteria provides a means to "close" the iteration loop among all possible embeddings and mappings to a restricted number of guesses and conduct the calculation of the black box model of a device in a pure automated way.

In the case where the experimental error is unknown as in the example presented above, a so-called "cross-validation" criterion can be applied to detect overfitting. For the cross-validation criterion, the deviation for the first subsets is compared to the deviation for the second subsets. If the difference between the deviations is more than a factor of approximately three for example, the model is said to be overfitted and the model is rejected. At this point, the steps of method 100 can be repeated with different parameters in an attempt to eliminate the overfitting.

In a second example, the method 100 and apparatus 300 of the present invention were applied to create a behavioral model of a sensor system used to facilitate calibration of the sensor. The sensor in this example was the infrared telescope of the Hubble Space Telescope (HST) and the calibration was the calibration of the focusing algorithm used in conjunction with the infrared telescope. The behavioral model that was produced by the method 100 and apparatus 300 of the present invention yielded a 30% improvement in focusing accuracy when compared to a physical model developed using the best available conventional modeling method. As in the first example, this example is illustrative only and it is not intended to limit the scope of the invention in any way.

In this example, the input data 210 comprised measurements of temperature at six locations on the HST, measurements of focus, and measurements of time. The output data 212 was the focus correction that was applied. The goal of developing the behavioral model in this example was to generate a model that enabled the prediction the focus correction that was required for combinations of measured input values that did not directly correspond to those measured. This is typical of a calibration situation wherein a limited number of measurements of conditions affecting a sensor are available. These available measurement are then used to provide predicted correction of the performance of a sensor over a much greater range of possible conditions.

The embedding dimension for this example was determined to be eight and embedding types that were chosen were: 1) time variable, 2) T1 variable, 3) wavelet of order 3 from T1 variable, 4) T4 variable, 5) wavelet of order 3 from T4 variable, 6) T5 variable, 7) first derivative of T5 variable, and 8) wavelet of order 3 from T5 variable. The reference to "T1 variable", "T4 variable" and "T5 variable" refer to portions of the input data 210 associated with temperature sensor 1, 4 and 5 respectively. The above referenced embedding dimension and embedding type was used to generate an embedded data set 213 from a first subset of the input data. A function was fit to the embedded data set 213 utilizing a corresponding first subset of the output data. The function was a $1^{st}$ order polynomial mapping of the eight embedded data set variables and was generated using the least squares method. The model was verified using a second subset of the input and output data. The correspondence between the measured output and the predicted output generated by the model was found to be excellent. As noted above, the model generated by the application of the method 100 of the present invention in this example unexpectedly and advantageously proved to be 30% more accurate at predicting the required focus correction of the HST infrared telescope than a physical model produced using conventional methods.

Thus there has been disclosed a new and non-obvious method and apparatus for the extraction of a behavioral model of a nonlinear device from embeddings of time-series of sampled and measured input and output signals. Changes and modifications may be made to the invention that may be readily apparent to those skilled in the art without going beyond the intended scope of the invention, as defined by the appended claims.

What is claimed is:

1. A method of producing a behavioral model of a nonlinear device from embeddings of time-domain measurements, the device being real or virtual having one or more input ports and one or more output ports, comprising:
    applying an input signal to the input port of the nonlinear device;
    sampling the input signal to produce input data;
    measuring a response to the input signal at the output port of the device to produce output data corresponding to the input data;
    creating an embedded data set using a first subset of the input data and a first subset of the output data;
    fitting a function to the embedded data set; and
    verifying the fitted function using a second subset of the input data and a second subset of the output data, wherein the verified fitted function is the behavioral model of the nonlinear device, and wherein the input signal is a uniformly distributed pseudo random sequence with a bandwidth equal to or greater than an input operational bandwidth of the nonlinear device.

2. The method of claim 1 further comprising filtering one or both of the input data produced in sampling and the output data produced in measuring before creating the embedded data set.

3. The method of claim 2, wherein filtering employs a nonlinear filtering to preserve a nonlinear response characteristic of the nonlinear device.

4. The method of claim 1, wherein the nonlinear device is a sensor and the behavioral model is used for generating calibration data for the sensor.

5. A method of producing a behavioral model of a nonlinear device from embeddings of time-domain measurements, the device being real or virtual having one or more input ports and one or more output ports, comprising:
    applying an input signal to the input port of the nonlinear device;
    sampling the input signal to produce input data;
    measuring a response to the input signal at the output port of the device to produce output data corresponding to the input data;
    creating an embedded data set using a first subset of the input data and a first subset of the output data;
    fitting a function to the embedded data set; and
    verifying the fitted function using a second subset of the input data and a second subset of the output data, wherein the verified fitted function is the behavioral model of the nonlinear device, and wherein the input signal comprises a set of i sine waves described by the equation $$s(i,j,t) = A(i)\sin(2\pi r(i)f(j)t) + B(i)$$

where i refers to an ith input port of the nonlinear device, j refers to a jth measurement performed on the nonlinear device to produce a jth subset of the output data and t is time, and where A(i) is an ith amplitude at the ith input port, r(i) is an ith ratio, f(j) is a frequency of a jth measurement, and B(i) is a bias level of the ith sine wave.

6. The method of claim 5 wherein the ratio r(i) is given by $$r(i) = \begin{cases} 1 & \text{for } i = 1 \\ \dfrac{p(2i-1)}{p(2i-2)} & \text{for } i > 1 \end{cases}$$

where an ith prime number p(i) is defined as $$p(1)=1;\ p(2)=2;\ p(3)=3;\ p(4)=5.$$

7. The method of claim 5, wherein the bias B(i) is given by $$B(i) = \frac{v(i) + V(i)}{2}$$

where amplitudes V(i) and v(i) are maximum and minimum values, respectively, for the ith input port of the nonlinear device.

8. The method of claim 5, wherein the nonlinear device is a sensor and the behavioral model is used for generating calibration data for the sensor.

9. The method of claim 8, wherein filtering employs a nonlinear filtering to preserve a nonlinear response characteristic of the nonlinear device.

10. The method of claim 5, further comprising filtering one or both of the input data produced in sampling and the output data produced in measuring before creating the embedded data set.

11. An apparatus for producing a behavioral model of a nonlinear device from embeddings of time domain measurements, the device having one or more inputs and one or more outputs comprising:

a signal generator for producing an input signal that is applied to the input of the device;

a data acquisition system for sampling the input signal, measuring an output signal at the output of the device in response to the input signal and producing input data and output data from the sampled input signal and from the measured output signal; and a signal processing computer for creating an embedded data set from a first subset of the input data and a first subset of the output data, for fitting a function to the embedded data set and for verifying that the fitted function models the device using a second subset of the input data and a second subset of the output data, wherein the signal generator is an arbitrary waveform generator, and wherein the input signal produced by the arbitrary waveform generator is a uniformly distributed pseudo random sequence with a bandwidth equal to or greater than an input operational bandwidth of the nonlinear device.

12. An apparatus for producing a behavioral model of a nonlinear device from embeddings of time domain measurements, the device having one or more inputs and one or more outputs comprising:

a signal generator for producing an input signal that is applied to the input of the device;

a data acquisition system for sampling the input signal, measuring an output signal at the output of the device in response to the input signal and producing input data and output data from the sampled input signal and from the measured output signal; and a signal processing computer for creating an embedded data set from a first subset of the input data and a first subset of the output data, for fitting a function to the embedded data set and for verifying that the fitted function models the device using a second subset of the input data and a second subset of the output data, wherein the input signal comprises of a set of i sine waves described by the equation $$s(i,j,t) = A(i)\sin(2\pi r(i)f(j)t) + B(i)$$

where i refers to an ith input port of the nonlinear device, j refers to a jth measurement performed on the nonlinear device to produce a jth subset of the output data and t is time, and where A(i) is an ith amplitude at the ith input port, r(i) is an ith ratio, f(j) is a frequency of a jth measurement, and B(i) is a bias level of the ith sine wave.

13. The apparatus of claim 12 further comprising a filter for removing noise from the input data and the output data before the embedded data set is created.

14. The apparatus of claim 12, wherein the ith bias B(i) is given by $$B(i) = \frac{v(i) + V(i)}{2}$$

where amplitudes V(i) and v(i) are maximum and minimum values, respectively, for the ith input port of the nonlinear device.

15. A method of generating an excitation signal for use in determining a behavioral model of a nonlinear device having one or more input ports and one or more output ports comprising:

producing a set of sine waves wherein the ith sine wave in the set is given by $$s(i,j,t) = A(i)\sin(2\pi r(i)f(j)t) + B(i)$$

where i refers to an ith input port of the nonlinear device, j refers to a jth measurement performed on the nonlinear device to produce a jth subset of the output data and t is time, and where A(i) is an ith amplitude at the ith input port, r(i) is an ith ratio, f(j) is a frequency of a jth measurement, and B(i) is a bias level of the ith sine wave.

16. The method of claim 15, further comprising:

computing the ith bias B(i) with the equation $$B(i) = \frac{v(i) + V(i)}{2}$$

where amplitudes V(i) and v(i) are maximum and minimum values, respectively, for the ith input port of the nonlinear device.

* * * * *